(12) United States Patent
Tanaka

(10) Patent No.: US 7,351,647 B2
(45) Date of Patent: *Apr. 1, 2008

(54) METHOD OF IRRADIATING A LASER BEAM, APPARATUS FOR IRRADIATING A LASER BEAM AND METHOD OF FABRICATING SEMICONDUCTOR DEVICES

(75) Inventor: Koichiro Tanaka, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/387,793

(22) Filed: Mar. 24, 2006

(65) Prior Publication Data

US 2006/0166470 A1 Jul. 27, 2006

Related U.S. Application Data

(62) Division of application No. 10/292,564, filed on Nov. 13, 2002, now Pat. No. 7,026,227.

(30) Foreign Application Priority Data

Nov. 16, 2001 (JP) ............................. 2001-351953

(51) Int. Cl.
*H01L 21/20* (2006.01)
*H01L 21/36* (2006.01)

(52) U.S. Cl. ..................................... 438/487
(58) Field of Classification Search ................ 438/486, 438/487
See application file for complete search history.

(56) References Cited

U.S. PATENT DOCUMENTS

| 4,327,972 A | 5/1982 | Brunsting |
| 4,432,648 A | 2/1984 | Musto et al. |
| 5,372,836 A | 12/1994 | Imahashi et al. |

(Continued)

FOREIGN PATENT DOCUMENTS

| JP | 02-051224 | 2/1990 |
| JP | 03-289128 | 12/1991 |
| JP | 05-102062 | 4/1993 |
| JP | 09-102468 | 4/1997 |

OTHER PUBLICATIONS

U.S. Appl. No. 10/252,828 entitled *Laser Irradiation Method and Laser Irradiation Device and Method of Manufacturing Semiconductor Device*, filed Sep. 24, 2002.
U.S. Appl. No. 10/207,769 entitled *Laser Irradiating Devise, Laser Irradiating Method and Manufacturing Method of Semiconductor Device*, filed Jul. 31, 2002.

*Primary Examiner*—W. David Coleman
(74) *Attorney, Agent, or Firm*—Eric J. Robinson; Robinson Intellectual Property Law Office, P.C.

(57) ABSTRACT

When a CW laser is irradiated to a semiconductor film while scanning relatively during a production process of a semiconductor device, elongated crystalline particles extending in the scanning direction are formed. The semiconductor film thus formed has characteristics substantially equal to a single crystal in the scanning direction. However, since the CW lasers is highly likely to induce interference, uniform laser irradiation is difficult to conduct. In this regard, interference of a laser beam can be decreased by setting the angle of incidence of the laser beam with respect to the surface of the semiconductor film is to be a desired angle other than 0°. In general, the output of the CW laser is small, so that the laser beam has to be scanned reciprocally in order to irradiate a region of a large area. However, as the angle of incidence is not set at 0°, the effect of the laser beam irradiation differs between the outward trip and the return trip. To decrease this, the angle of incidence is made variable so that the condition of the laser beam irradiation can be equal between the outward trip and the return trip.

40 Claims, 17 Drawing Sheets

U.S. PATENT DOCUMENTS

| | | |
|---|---|---|
| 5,604,635 A | 2/1997 | Lawandy |
| 5,643,826 A | 7/1997 | Ohtani et al. |
| 5,854,803 A | 12/1998 | Yamazaki et al. |
| 5,888,839 A | 3/1999 | Ino et al. |
| 6,136,632 A | 10/2000 | Higashi |
| 6,160,827 A | 12/2000 | Tanaka |
| 6,248,606 B1 | 6/2001 | Ino et al. |
| 6,602,744 B1 | 8/2003 | Ino et al. |
| 6,638,800 B1 | 10/2003 | Ishihara et al. |
| 6,660,609 B2 | 12/2003 | Tanaka et al. |
| 6,806,099 B2 | 10/2004 | Takeda et al. |
| 6,849,482 B2 | 2/2005 | Yamazaki et al. |
| 6,861,614 B1 | 3/2005 | Tanabe et al. |
| 2002/0094008 A1 | 7/2002 | Tanaka |
| 2003/0021307 A1 | 1/2003 | Yamazaki |
| 2003/0024905 A1 | 2/2003 | Tanaka |
| 2003/0035129 A1 | 2/2003 | Phillips et al. |
| 2003/0038123 A1 | 2/2003 | Dykes et al. |
| 2003/0080100 A1 | 5/2003 | Yamazaki et al. |
| 2003/0086182 A1 | 5/2003 | Tanaka et al. |
| 2003/0089690 A1 | 5/2003 | Yamazaki et al. |

FIG. 3A

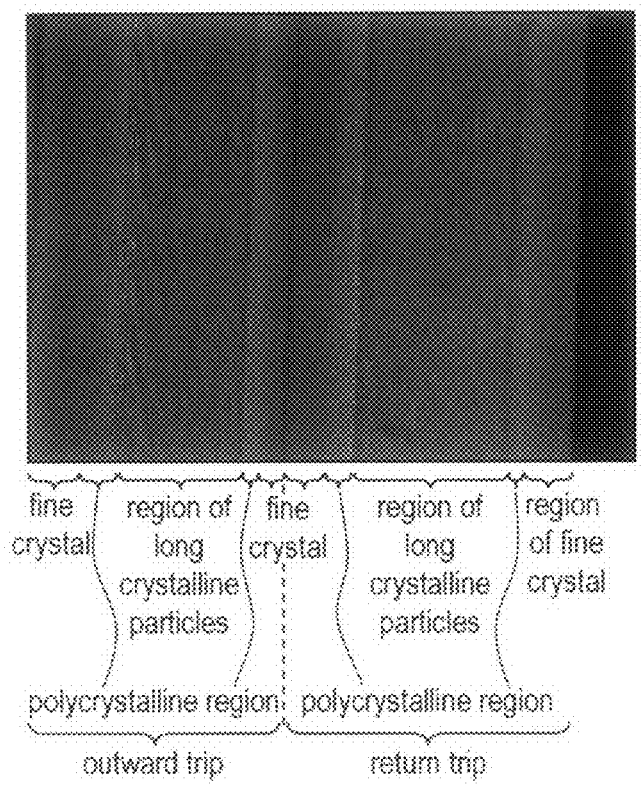

fine crystal | region of long crystalline particles | fine crystal | region of long crystalline particles | region of fine crystal polycrystalline region | polycrystalline region outward trip | return trip

FIG. 3B

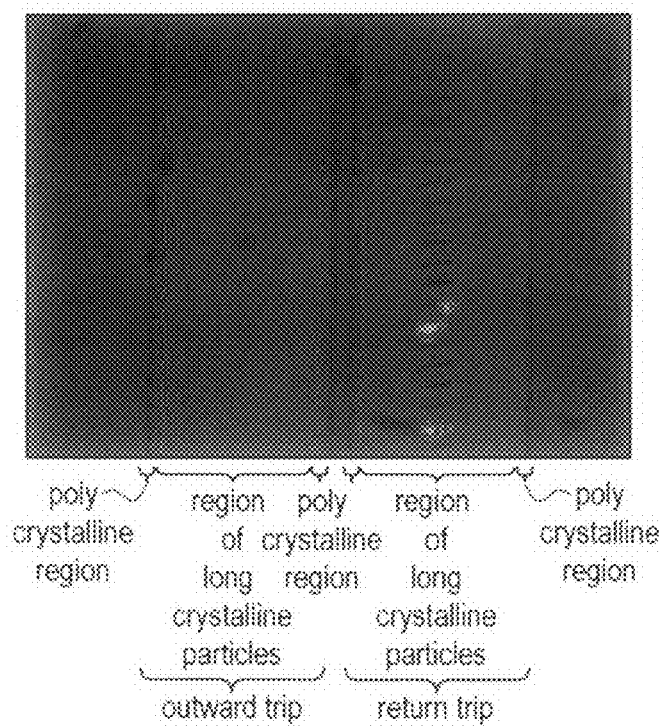

poly crystalline region | region of long crystalline particles | poly crystalline region | region of long crystalline particles | poly crystalline region outward trip | return trip

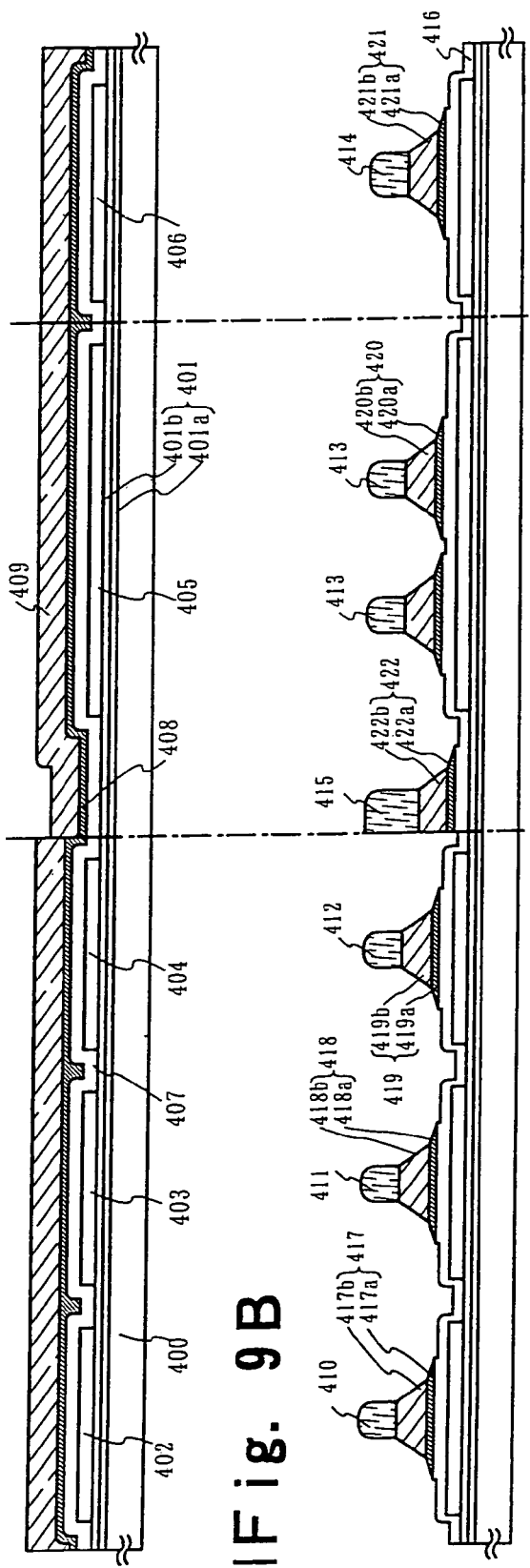
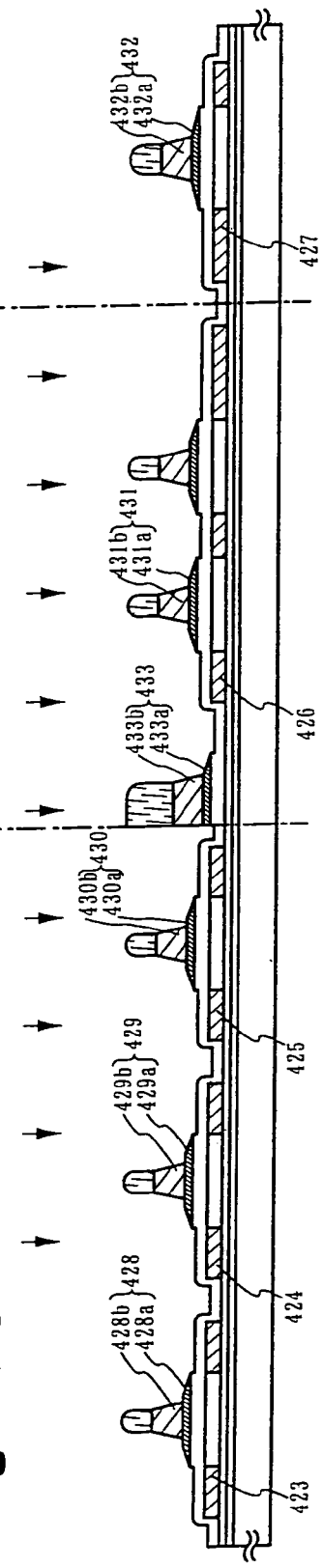
Fig. 9A
Fig. 9B
Fig. 9C

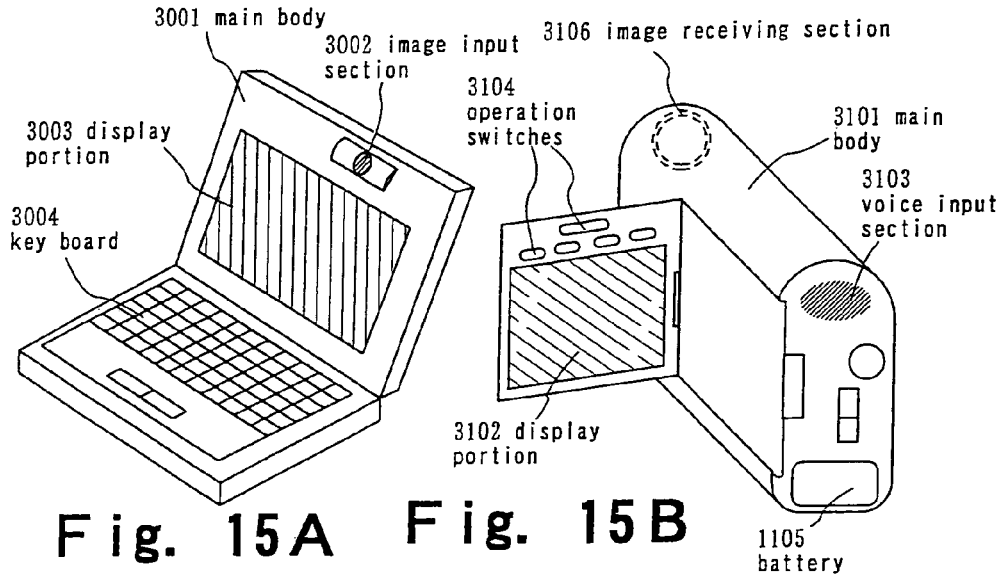
Fig. 15A   Fig. 15B
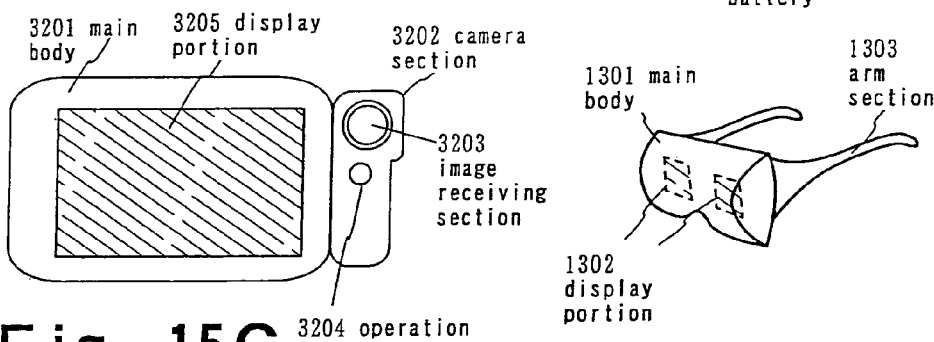
Fig. 15C   Fig. 15D
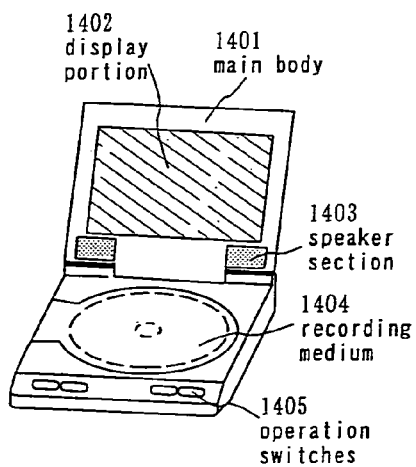  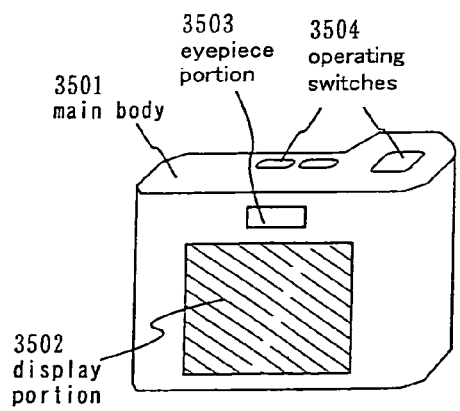
Fig. 15E   Fig. 15F

METHOD OF IRRADIATING A LASER BEAM, APPARATUS FOR IRRADIATING A LASER BEAM AND METHOD OF FABRICATING SEMICONDUCTOR DEVICES

BACKGROUND OF THE INVENTION

1. Field of the Invention

The present invention relates to a laser beam irradiation method and a laser irradiation apparatus for using the method (apparatus including a laser and an optical system for guiding laser beam emitted from the laser to an object to be illuminated). In addition, the present invention relates to a method of manufacturing a semiconductor device, which includes a laser beam irradiation step. Note that a semiconductor device described here includes an electro-optical device such as a liquid crystal display device or a light emitting device, and an electronic device that includes the electro-optical device as a part.

2. Description of the Related Art

In recent years, an extensive study has been made on a technique in which an amorphous semiconductor film formed on an insulating substrate made of glass or the like is crystallized so that a semiconductor film having crystal structure (hereafter referred to as crystalline semiconductor film) is obtained. As the methods of crystallization such as a thermal annealing method using furnace annealing, a rapid thermal annealing method (RTA method), a laser annealing method and the like were examined. Anyone thereof or combining two or more methods thereof can be carried out for crystallization.

In comparison with an amorphous semiconductor film, a crystalline semiconductor film has extreme high mobility. Since thus, the crystalline semiconductor film is used to form a thin film transistor (referred to as TFT), for example, the TFT can be used in an active matrix type liquid crystal display device etc. in which TFTs for pixel portion, TFTs for pixel portion and TFTs for driver circuit are formed on one glass substrate.

Generally, in order to crystallize an amorphous semiconductor in annealing furnace, a thermal treatment at 600° C. or more for 10 hours or more is required. A quartz is an applicable material of substrate for this crystallization, but the quartz substrate is too expensive in price and is very difficult to be manufactured especially in a large area. In order to improve the productivity efficiency, manufacturing the substrate in a large area is acceptable. There is a reason why the research to form the semiconductor film on the glass substrate that is cheap and easy to manufactured in a large area substrate is advanced in this point. It is expected that a glass substrate in which a length of one side exceeds 1 m will be also used in recent years.

On the other hand, a method of thermal crystallization by using metal elements disclosed in Japanese Patent Application Laid Open No. 7-183540 enable the crystallization temperature, which was a conventional problem, to be realized at a low temperature. The crystalline semiconductor film can be formed by this method in which a small amount of an element such as nickel, palladium and lead is added to an amorphous semiconductor film, then the amorphous semiconductor film is heated for four hours at 550° C. If the heat treatment is conducted at 550° C., there is no change in shape of the substrate etc. since the temperature is lower than the strain point of a glass substrate.

Since the laser annealing method can deliver high energy only to the semiconductor film without substantially increasing the temperature in substrate, the laser annealing technology comes under spotlight by its appliance in a glass substrate with a low strain point as a matter of course, and a plastic substrate, etc.

An example of the laser annealing method is a method of forming pulse laser beam from an excimer laser or the like by an optical system such that it becomes a square spot of several cm or a linear shape of 100 mm or more in length on a surface being illuminated, and relatively shifting an irradiation position of the laser beam with respect to the surface being illuminated to conduct annealing. The "linear shape" described here indicates not a "line" in the strict sense but a rectangular shape (or a prolate elliptical shape) having a high aspect ratio. For example, although, it indicates a shape having an aspect ratio of 2 or more (preferably, 10 to 100), it does not make any difference from that a shape at a surface being irradiated is being contained in the laser light having rectangular shape (rectangular shape beam). Note that the linear shape is used to obtain an energy density required for annealing an object sufficiently to be irradiated. Thus, if sufficient annealing is conducted for the object to be irradiated, it may be a rectangular shape and a tabletop shape.

However, the crystalline semiconductor film manufactured by the laser annealing method is formed from a plurality of crystal grains, and the position and the size of the crystal grains are random. The TFT manufactured on the glass substrate is formed by separating the crystalline semiconductor film with island-like patterning in order to realize element isolation. In this case, the crystalline semiconductor film cannot be formed with the designation of the position and the size of the crystal grains. There exist numerous recombination centers and trapping centers which derive from an amorphous structure, a crystal defect or the like exist in an interface of the crystal grain (crystal grain boundary) compared with the inside of the crystal grain. It is known that when a carrier is trapped in the trapping center, the potential of the crystal grain boundary rises, which becomes a barrier to the carrier, whereby the current transporting property of the carrier is lowered. The crystallinity of the semiconductor film in a channel forming region has a great effect on the characteristic of the TFT. However, it is hardly possible that the channel forming region is formed of a single crystal semiconductor film without influence of the crystal grain boundary.

In recent years, attention has been given to technology according to which crystals are continuously grown in the scanning direction by irradiating a semiconductor film with a CW laser which is scanned in one direction thereby to form single crystalline particles which are extending in that direction. It is considered that this method makes it possible to form the crystals without almost containing crystalline grain boundaries in at least the channel direction of the TFTs. However, this method uses the CW laser of a wavelength region which is sufficiently absorbed by the semiconductor film. The CW laser, however, is capable of producing an output which is as very small as about 10 watts. From the standpoint of production, therefore, this method is inferior to the technology which uses the excimer laser. The CW laser suited for this method has a large output, has a wavelength shorter than that of a visible ray and has a very high stability in the output. Examples may include second harmonics of a $YVO_4$ laser, second harmonics of a YAG laser, second harmonics of a YLF laser, second harmonics of a glass laser, second harmonics of a $YAlO_3$ laser and an Ar laser. The lasers of the above harmonics are generally doped with Nd which undergoes excitation to oscillate the laser. The kind of dopant may be suitably selected by a person who executes the method. However, the lasers described above are highly likely to induce interference causing a shading in the irradiation due to interference. Besides, the semiconductor is irregularly annealed depending upon a difference in the angle of incidence of laser beam upon the semiconductor film. This invention was achieved to solve such defects.

SUMMARY OF THE INVENTION

In the step of crystallizing the semiconductor film by a CW laser, attempts have been made vigorously to crystallize the semiconductor film by shaping the laser beam into an oval shape on the surface of irradiation in order to enhance the productivity as much as possible, and effecting the scanning in the direction of short diameter of the oval laser beam (hereinafter referred to as oval beam). The laser beam after the shaping assumes the oval shape because of the reason that the initial laser beam has a circular shape or a shape close thereto. Or, if the initial shape of the laser beam is rectangular, then, this shape may be expanded in one direction by using a cylindrical lens into a more elongated rectangular shape to use it. In this specification, the oval beam and the rectangular beam are both referred to as elongated beam. Further, a plurality of laser beams may be shaped into elongated beams, respectively, and may be connected together to produce a further elongated beam. This invention provides a method of irradiating an elongated beam with little irradiation shading in the above steps, an apparatus for the irradiation and a method of fabricating semiconductor devices.

The constitution of the invention related to the apparatus for irradiating a laser beam disclosed in this specification comprises:

a laser;

means for shaping a laser beam emitted from the laser into an elongated beam on the surface of irradiation or in the vicinities thereof;

means for moving the surface of irradiation in a first direction with respect to the laser beam;

means for moving the surface of irradiation in a second direction which is opposite to the first direction with respect to the laser beam; and means for inverting the angle of incidence of the laser beam with respect to the irradiation surface on a plane perpendicular to the first direction.

Another constitution of the invention related to the apparatus for irradiating a laser beam disclosed in this specification comprises:

a laser;

means for shaping a laser beam emitted from the laser into an elongated beam on the surface of irradiation or in the vicinities thereof;

means for moving the surface of irradiation in a first direction with respect to the laser beam;

means for moving the surface of irradiation in a second direction which is opposite to the first direction with respect to the laser beam; and means for rendering an inner product of a unit vector in the first direction and a unit vector in the direction of incidence of the laser beam with respect to the irradiation surface to be equal to an inner product of a unit vector in the second direction and a unit vector in the direction of incidence of the laser beam with respect to the irradiation surface by varying the angle of incidence of the laser beam with respect to the substrate depending upon the direction of movement.

In the above constitution of the invention, a feature resides in that the laser is a continuously oscillating gas laser, a solid laser or a metal laser. As the gas laser, there can be used an Ar laser, a Kr laser, an XeF excimer laser or a $CO_2$ laser. As the solid laser, there can be used a YAG laser, a $YVO_4$ laser, a YLF laser, a $YAlO_3$ laser, a glass laser, a ruby laser, an alexandrite laser or a Ti:sapphire laser. As the metal laser, there can be used a helium cadmium laser, a copper vapor laser or a gold vapor laser.

In the constitution of the invention, a feature resides in that the laser beam is converted into higher harmonics through a nonlinear optical element. An excellent conversion efficiency is obtained if a crystal called LBO, BBO, KDP, KTP, KB5 or CLBO is used as the nonlinear optical element. The conversion efficiency can be greatly enhanced by introducing the nonlinear optical element in a laser resonator.

In the constitution of the invention, further, if the laser beam is oscillated by $TEM_{00}$, the obtained elongated beam offers improved homogeneity of energy, which is desirable.

In the constitution of the invention, further, if a plane perpendicular to the irradiation surface and including a short side (called short diameter in this specification) of when the elongated beam is presumed to be a rectangle, is defined as a plane of incidence, a feature resides in that the angle $\phi$ of incidence of the laser beam satisfies a formula, $$\phi \geq \arctan(W/2d)$$

where W is a length of the short side, and d is a thickness of the substrate which is placed on the irradiation surface and permits the laser beam to pass through.

When the locus of laser beam does not exist on the plane of incidence, $\phi$ is regarded to be the angle of incidence of the locus that is projected onto the plane of incidence. If the laser beam is incident at the angle $\phi$ of incidence, then, light reflected by the surface of the substrate does not interfere with light reflected from the back surface of the substrate, and the laser beam is homogeneously irradiated. The above formula is calculated with the refractive index of the substrate as 1. A glass substrate usually has a refractive index of about 1.5. If this is taken into consideration, a minimum value of $\phi$ may slightly increase. However, since the energy density at an end of the beam is lower than that at the center, the effect for decreasing the interference is obtained to a sufficient degree even within the range of the above formula.

As the substrate, there can be used a glass substrate, a quartz substrate, a silicon substrate, a plastic substrate, a metal substrate, a stainless steel substrate or a flexible substrate. As the glass substrate, there can be exemplified a substrate such as of barium borosilicate glass or aluminum borosilicate glass. The flexible substrate is the one of the form of a film such as of PET, PES, PEN or acrylic resin. It is expected that the weight can be decreased if the semiconductor device is fabricated by using a flexible substrate. If a barrier layer such as an aluminum film (AlON, AlN, AlO, etc.), a carbon film (DLC (diamond-like carbon), etc.) or an SiN film is formed as a single layer or a multiplex layer on the front surface or on the front surface and on the back surface of the flexible substrate, then, durability is improved, which is desirable. Here, it needs not be pointed out that the above formula holds only when the substrate permits the laser beam to pass through.

In the constitution of the invention, further, the length W of the short side can be approximated as, $$W = f\theta/M$$

where θ is a broadening angle of the laser beam emitted from the laser, M is an expanding factor of a beam expander that expands the laser beam, and f is a focal distance of the lens that focuses the laser beam in the direction of the short side on the irradiation surface.

Here, if W is set to be not larger than 50 μm, then, the time for irradiating the laser beam can be shortened, which is desirable. Namely, it is desired that W=fθ/M≦50 μm.

Further, the constitution of the invention related to the method of irradiating a laser beam disclosed in this specification comprises:

shaping a laser beam into an elongated beam on the irradiation surface or in the vicinities thereof;

irradiating the irradiation surface while moving the irradiation surface in a first direction at a first angle of incidence with respect to the elongated beam; and irradiating the irradiation surface while moving the irradiation surface in a second direction which is opposite to the first direction at a second angle of incidence with respect to the elongated beam;

wherein a relationship between the first direction and the first angle of incidence is inverted with respect to a relationship between the second direction and the second angle of incidence on a plane which is perpendicular to the first direction.

Another constitution of the invention related to the method of irradiating a laser beam disclosed in this specification comprises:

shaping a laser beam into an elongated beam on the irradiation surface or in the vicinities thereof;

irradiating the irradiation surface while moving the irradiation surface in a first direction in parallel with the short diameter direction of the elongated beam at a first angle of incidence with respect to the elongated beam; and irradiating the irradiation surface while moving the irradiation surface in a second direction which is opposite to the first direction at a second angle of incidence with respect to the elongated beam;

wherein a relationship between the first direction and the first angle of incidence is inverted with respect to a relationship between the second direction and the second angle of incidence on a plane which is perpendicular to the first direction.

In the above constitution of the invention, a feature resides in that the laser is a continuously oscillating gas laser, a solid laser or a metal laser. As the gas laser, there can be used an Ar laser, a Kr laser, an XeF excimer laser or a $CO_2$ laser. As the solid laser, there can be used a YAG laser, a $YVO_4$ laser, a YLF laser, a $YAlO_3$ laser, a glass laser, a ruby laser, an alexandrite laser or a Ti:sapphire laser. As the metal laser, there can be used a helium cadmium laser, a copper vapor laser or a gold vapor laser.

In the constitution of the invention, a feature resides in that the laser beam is converted into higher harmonics through a nonlinear optical element. An excellent conversion efficiency is obtained if a crystal called LBO, BBO, KDP, KTP, KB5 or CLBO is used as the nonlinear optical element. The conversion efficiency can be greatly enhanced by incorporating the nonlinear optical element in a laser resonator.

In the constitution of the invention, further, if the laser beam is oscillated by $TEM_{00}$, the obtained elongated beam offers improved homogeneity of energy, which is desirable.

In the constitution of the invention, further, if a plane perpendicular to the irradiation surface and including a short side of when the elongated beam is presumed to be a rectangle, is defined as a plane of incidence, a feature resides in that the angle φ of incidence of the laser beam satisfies a formula, $$\phi \geq \arctan(W/2d)$$

where W is a length of the short side, and d is a thickness of the substrate that is placed on the irradiation surface and permits the laser beam to pass through.

When the locus of laser beam does not exist on the plane of incidence, φ is regarded to be the angle of incidence of the locus that is projected onto the plane of incidence. If the laser beam is incident at the angle φ of incidence, then, light reflected by the surface of the substrate does not interfere with light reflected from the back surface of the substrate, and the laser beam is homogeneously irradiated. The above formula is calculated with the refractive index of the substrate as 1. A glass substrate usually has a refractive index of about 1.5. If this is taken into consideration, a minimum value of φ may slightly increase. However, since the energy density at an end of the beam is lower than that at the center, the effect for decreasing the interference is obtained to a sufficient degree even within the range of the above formula.

As the substrate, there can be used a glass substrate, a quartz substrate, a silicon substrate, a plastic substrate, a metal substrate, a stainless steel substrate or a flexible substrate. Here, it needs not be pointed out that the above formula holds only when the substrate permits the laser beam to pass through.

In the constitution of the invention, further, the length W of the short side can be approximated as, $$W=f\theta/M$$

where θ is a broadening angle of the laser beam emitted from the laser, M is an expanding factor of a beam expander that expands the laser beam, and f is a focal distance of the lens that focuses the laser beam in the direction of the short side on the irradiation surface.

Here, if W is set to be not larger than 50 μm, then, the time for irradiating the laser beam can be shortened, which is desirable. Namely, it is desired that W=fθ/M≦50 μm.

Further, the constitution of the invention related to the method of fabricating a semiconductor device disclosed in this specification comprises:

shaping a laser beam into an elongated beam on a semiconductor film or in the vicinities thereof;

irradiating the semiconductor film while moving the semiconductor film in a first direction at a first angle of incidence with respect to the elongated beam; and irradiating the semiconductor film while moving the semiconductor film in a second direction which is opposite to the first direction at a second angle of incidence with respect to the elongated beam to thereby crystallize the semiconductor film;

wherein the direction of incidence of the laser beam forming the first angle of incidence is inverted with respect to the direction of incidence of the laser beam forming the second angle of incidence on a plane which is perpendicular to the first direction.

Another constitution of the invention related to the method of fabricating a semiconductor device disclosed in this specification comprises:

shaping a laser beam into an elongated beam on a semiconductor film or in the vicinities thereof;

irradiating the semiconductor film while moving the semiconductor film in a first direction in parallel with the short diameter direction of the elongated beam at a first angle of incidence with respect to the elongated beam; and irradiating the semiconductor film while moving the semiconductor film in a second direction which is opposite to the first direction at a second angle of incidence with respect to the elongated beam to thereby crystallize the semiconductor film;

wherein the direction of incidence of the laser beam forming the first angle of incidence is inverted with respect to the direction of incidence of the laser beam forming the second angle of incidence on a plane which is perpendicular to the first direction.

In the above constitution of the invention, a feature resides in that the laser is a continuously oscillating gas laser, a solid laser or a metal laser. As the gas laser, there can be used an Ar laser, a Kr laser, an XeF excimer laser or a $CO_2$ laser. As the solid laser, there can be used a YAG laser, a $YVO_4$ laser, a YLF laser, a $YAlO_3$ laser, a glass laser, a ruby laser, an alexandrite laser or a Ti:sapphire laser. As the metal laser, there can be used a helium cadmium laser, a copper vapor laser or a gold vapor laser.

In the constitution of the invention, a feature resides in that the laser beam is converted into higher harmonics through a nonlinear optical element. An excellent conversion efficiency is obtained if a crystal called LBO, BBO, KDP, KTP, KB5 or CLBO is used as the nonlinear optical element. The conversion efficiency can be greatly enhanced by introducing the nonlinear optical element in a laser resonator.

In the constitution of the invention, further, if the laser beam is oscillated by $TEM_{00}$, the obtained elongated beam offers improved homogeneity of energy, which is desirable.

In the constitution of the invention, further, if a plane perpendicular to the semiconductor film and including a short side of when the elongated beam is presumed to be a rectangle, is defined as a plane of incidence, a feature resides in that the angle $\phi$ of incidence of the laser beam satisfies a formula, $$\phi \leq \arctan(W/2d)$$

where W is a length of the short side (called short diameter in this specification), and d is a thickness of the substrate which has the semiconductor film formed thereon and permits the laser beam to pass through.

When the locus of laser beam does not exist on the plane of incidence, $\phi$ is regarded to be the angle of incidence of the locus that is projected onto the plane of incidence. If the laser beam is incident at the angle $\phi$ of incidence, then, light reflected by the surface of the substrate does not interfere with light reflected from the back surface of the substrate, and the laser beam is homogeneously irradiated. The above formula is calculated with the refractive index of the substrate as 1. A glass substrate usually has a refractive index of about 1.5. If this is taken into consideration, a minimum value of $\phi$ may slightly increase. However, since the energy density at an end of the beam is lower than that at the center, the effect for decreasing the interference is obtained to a sufficient degree even within the range of the above formula.

As the substrate, there can be used a glass substrate, a quartz substrate, a silicon substrate, a plastic substrate, a metal substrate, a stainless steel substrate or a flexible substrate. Here, it needs not be pointed out that the above formula holds only when the substrate permits the laser beam to pass through.

In the constitution of the invention, further, the length W of the short side can be approximated as, $$W = f\theta/M$$

where $\theta$ is a broadening angle of the laser beam emitted from the laser, M is an expanding factor of a beam expander that expands the laser beam, and f is a focal distance of the lens that focuses the laser beam in the direction of the short side on the irradiation surface.

Here, if W is set to be not larger than 50 μm, then, the time for irradiating the laser beam can be shortened, which is desirable. Namely, it is desired that $W=f\theta/M \leq 50$ μm.

If the laser beam is incident on the semiconductor film at an angle of incidence satisfying the formula contemplated by the invention and if the angle of incidence of the laser beam is alternately changed depending upon the direction of scanning the semiconductor film with respect to the laser beam, then, there is no difference in the irradiation with the laser beam due to the scanning direction, and a homogeneous irradiation with the laser beam is realized. This invention is particularly suited for improving the crystallization and crystallinity of the semiconductor film and for activating the impurity elements. Further, the throughput is improved owing to the homogeneous irradiation with the laser beam irrespective of the scanning direction. The semiconductor device as represented by the liquid crystal display device of the active matrix type utilizing the invention exhibits improved operation characteristics and reliability. Further, the semiconductor device is produced at a decreased cost.

BRIEF DESCRIPTION OF THE DRAWINGS

FIGS. 3A, B are diagrams illustrating a difference in the CW laser depending upon the outward trip and the return trip in the scanning direction for explaining a third embodiment;

FIGS. 9A, B and C are sectional views illustrating the steps of fabricating pixel TFTs and drive circuit TFTs;

FIGS. 15A to F are views illustrating examples of the semiconductor device;

DETAILED DESCRIPTION OF THE PREFERRED EMBODIMENTS

Embodiment Mode

Figure 1:
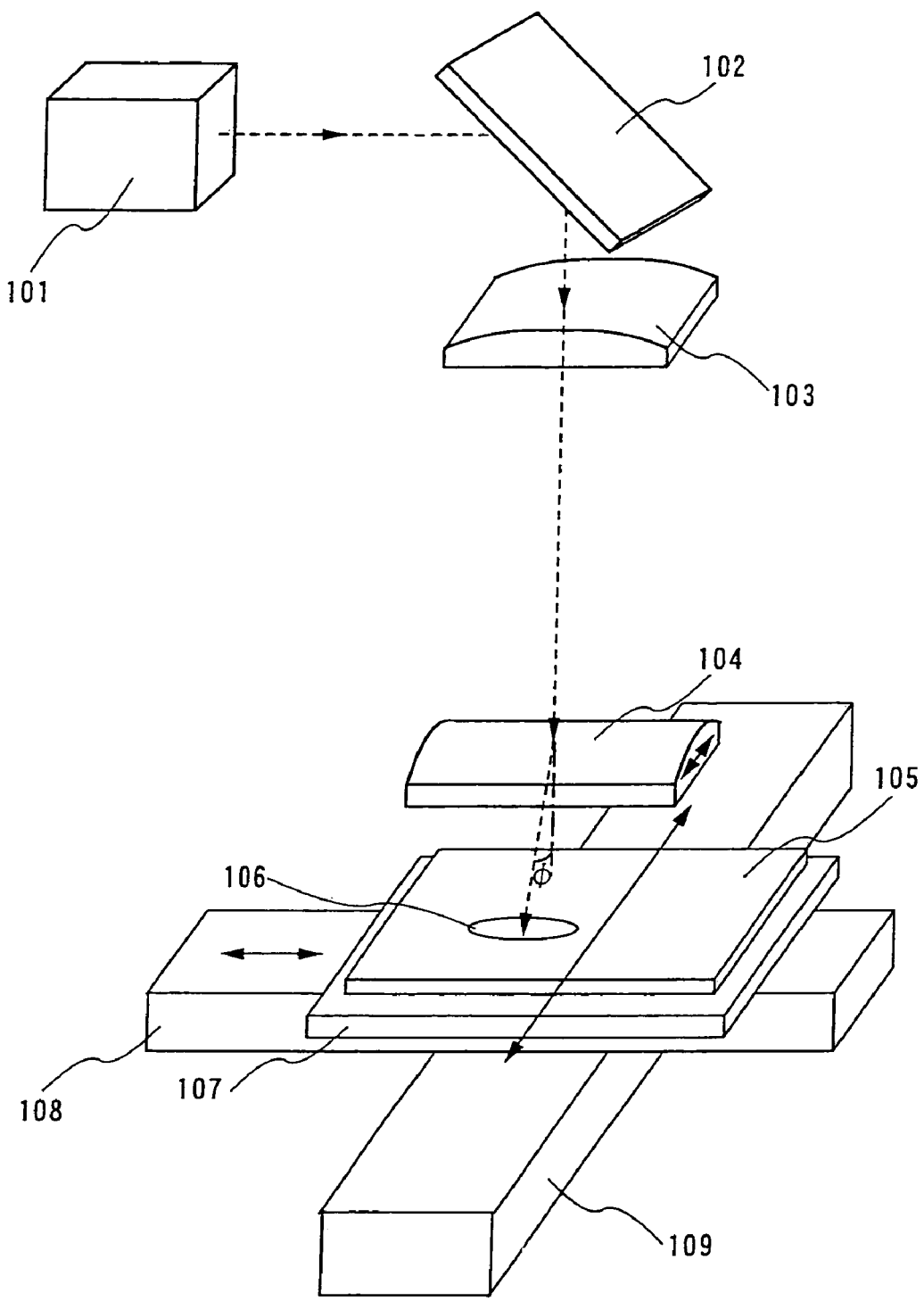
FIG. 1 is a view illustrating an embodiment of the invention.
Figure 4A:
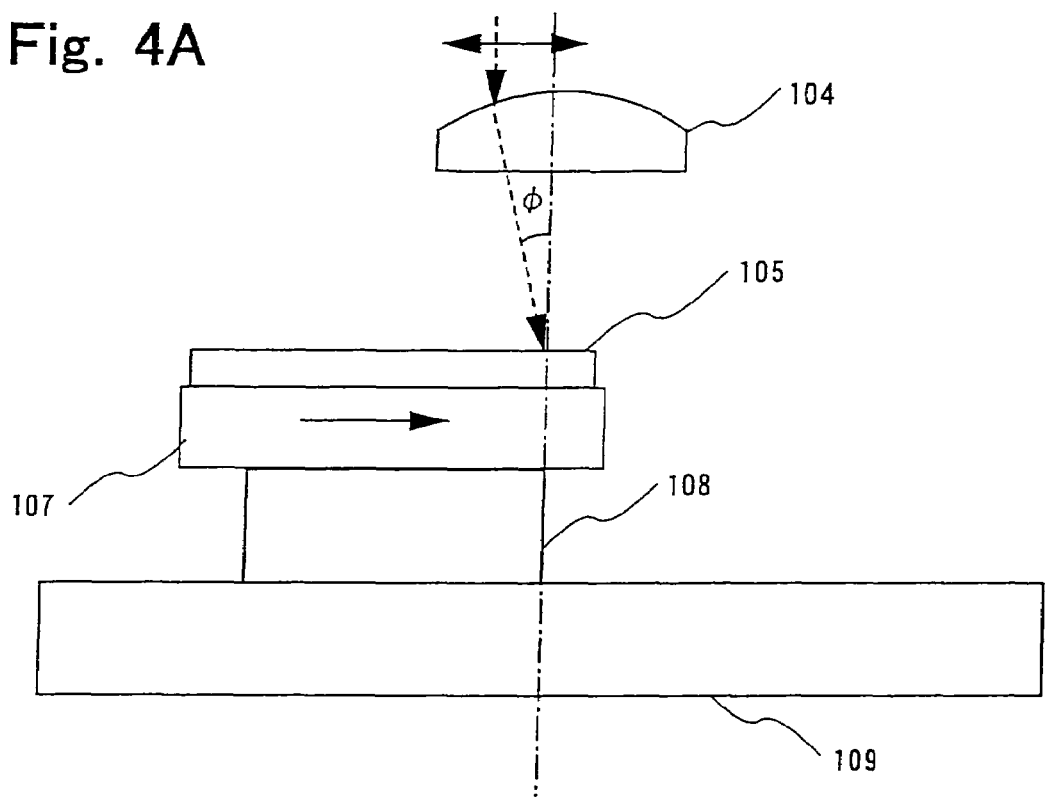
FIGS. 4A, B are views illustrating an apparatus for irradiating a laser beam.

An embodiment mode of the invention will now be described with reference to FIGS. 1 and 4A, B. In this embodiment mode, an oval beam 106 is formed and is projected onto the surface of a semiconductor film 105.

Figure 4B:
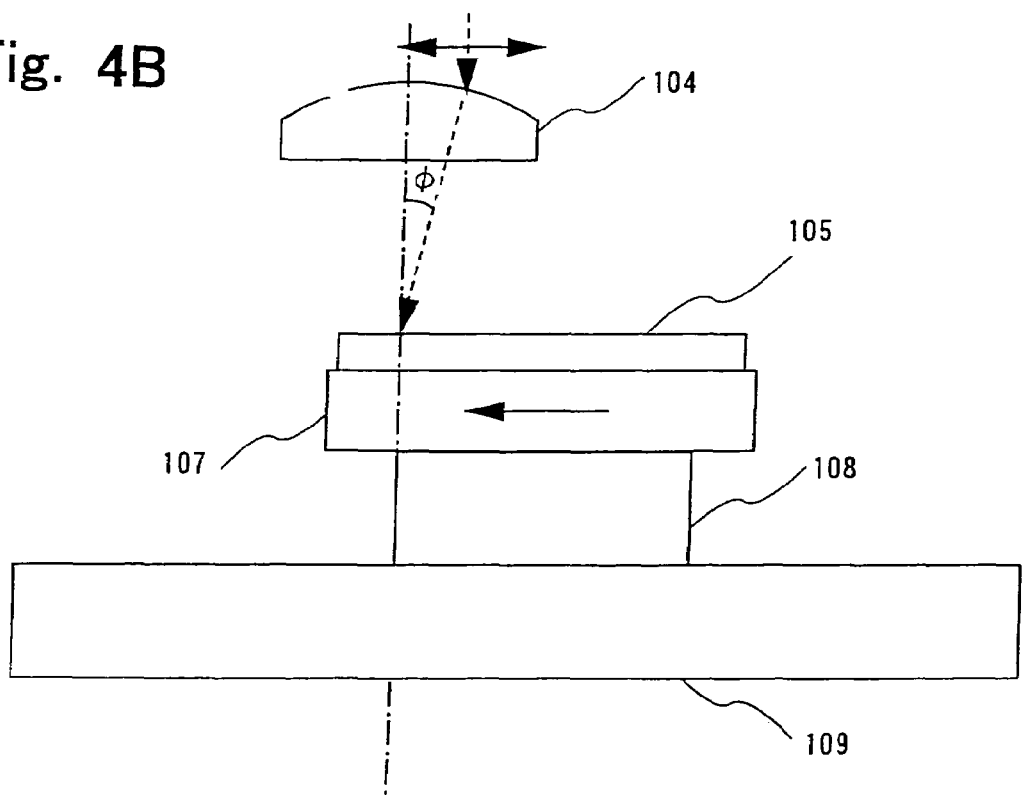

First, a 10-watt laser oscillator 101 (Nd:YVO$_4$ laser, CW, second harmonics) of the LD excitation type is provided. The laser oscillator is of the TEM00 oscillation mode incorporating an LBO crystal in the resonator, and is converted into second harmonics. The beam diameter is 2.25 mm, and the broadening angle is about 0.3 mrad. The direction of travel of the laser beam is converted by a 45° reflection mirror into the vertical direction. Next, in order that the oval beam assumes a long diameter of about 500 μm on the surface of the semiconductor film 105, the laser beam is permitted to fall vertically on a cylindrical lens 103 having a focal distance of 150 mm. Further, a cylindrical lens 104 having a focal distance of 20 mm is disposed at a position 100 mm under the cylindrical lens 103. The length of the short diameter of the oval beam 106 is controlled by the cylindrical lens 104. Theoretically, the short diameter W becomes about 6 μm in this system. In order for the short diameter to assume a desired length, the optical system may be assembled according to the above formula. For example, when the beam is expanded by using a beam expander having a magnification of M times, it is allowed to obtain a short diameter which is further decreased (having a length of 1/M as compared to that of when no beam expander is used). To increase the focal depth, the beam waist of the laser beam focused by the cylindrical lens 104 should be brought to the surface of the semiconductor film 105. The cylindrical lenses 103 and 104 are so arranged that their generating lines are at right angles with each other. In the cylindrical lens 104 as shown in FIG. 4, the laser beam is incident at a position which is moved in parallel in a direction in which the cylindrical lens 104 is curved. This changes the direction of travel of the laser beam, and the angle of incidence of the laser beam on the surface of the semiconductor film 105 becomes φ ($\neq 0°$).

The substrate on which the semiconductor film is formed is a glass substrate having a thickness d, and is secured to an adsorption stage 107 so will not to fall when it is irradiated with the laser beam. The adsorption stage 107 operates on a plane in parallel with the surface of the semiconductor film 105 in the X- and Y-directions due to a monoaxial robot 108 for X-axis and a monoaxial robot 109 for Y-axis. The conditional formula which does not permit interference is $\phi \geq \arctan(W/2d)$. Therefore, if the substrate having a thickness of, for example, 0.7 mm is used, then, $\phi \geq 0.24°$.

In practice, the short diameter of an oval beam becomes thicker than a theoretical value due to accuracy of the lens and, hence, it is safer to select a slightly large value as φ. For example, an oval beam having a short diameter of about 50 μm can be easily formed. If this is put to the above formula, then, $\phi \geq 2.0°$.

Next, described below is the method of fabricating the semiconductor film. The semiconductor film is formed on a glass substrate which is transparent to the visible light rays. Concretely speaking, a film of silicon oxynitride is formed maintaining a thickness of 200 nm on one surface of a glass substrate of a thickness of 0.7 mm, and an a-Si film is formed thereon maintaining a thickness of 150 nm by the plasma CVD method. In order to heighten the resistance of the semiconductor film against the laser, further, the semiconductor film is hot-annealed at 500° C. for one hour. In addition to being hot-annealed, the semiconductor film may be crystallized using a metal element described earlier in connection with the related art of the invention. The optimum conditions for the laser beam irradiation are nearly the same irrespective of either film is used.

Next, described below is an example of irradiating the semiconductor film with the laser. The laser oscillator 101 has a maximum output of about 10 watts from which, however, a sufficiently large energy density is obtained since the size of the oval beam 106 is relatively small. Therefore, the irradiation is effected by decreasing the output down to about 5.5 watts. By using the Y-axis robot 109, the substrate on which the semiconductor film is formed is scanned in the direction of short diameter of the oval beam 106, so that single crystalline particles are formed in a manner of being laid extending in the scanning direction which is in the direction of long diameter of the oval beam 106 over a region of a width of 100 μm. Hereinafter, the above region is referred to as a region of elongated crystalline particles. Here, the angle of incidence of the laser beam is set to be not smaller than 2° by taking a margin into consideration. This suppresses interference, and a more homogeneous irradiation with laser is accomplished. Though the oval beam has a long diameter of about 500 μm, the laser beam is in the TM00 mode. Accordingly, the energy distribution is Gaussian, and the region of the long crystalline particles is formed in only the central portion of Gaussian. The scanning speed is preferably from tens of centimeters a second to hundreds of centimeters a second but is selected to be 50 centimeters a second here.

Figure 6:
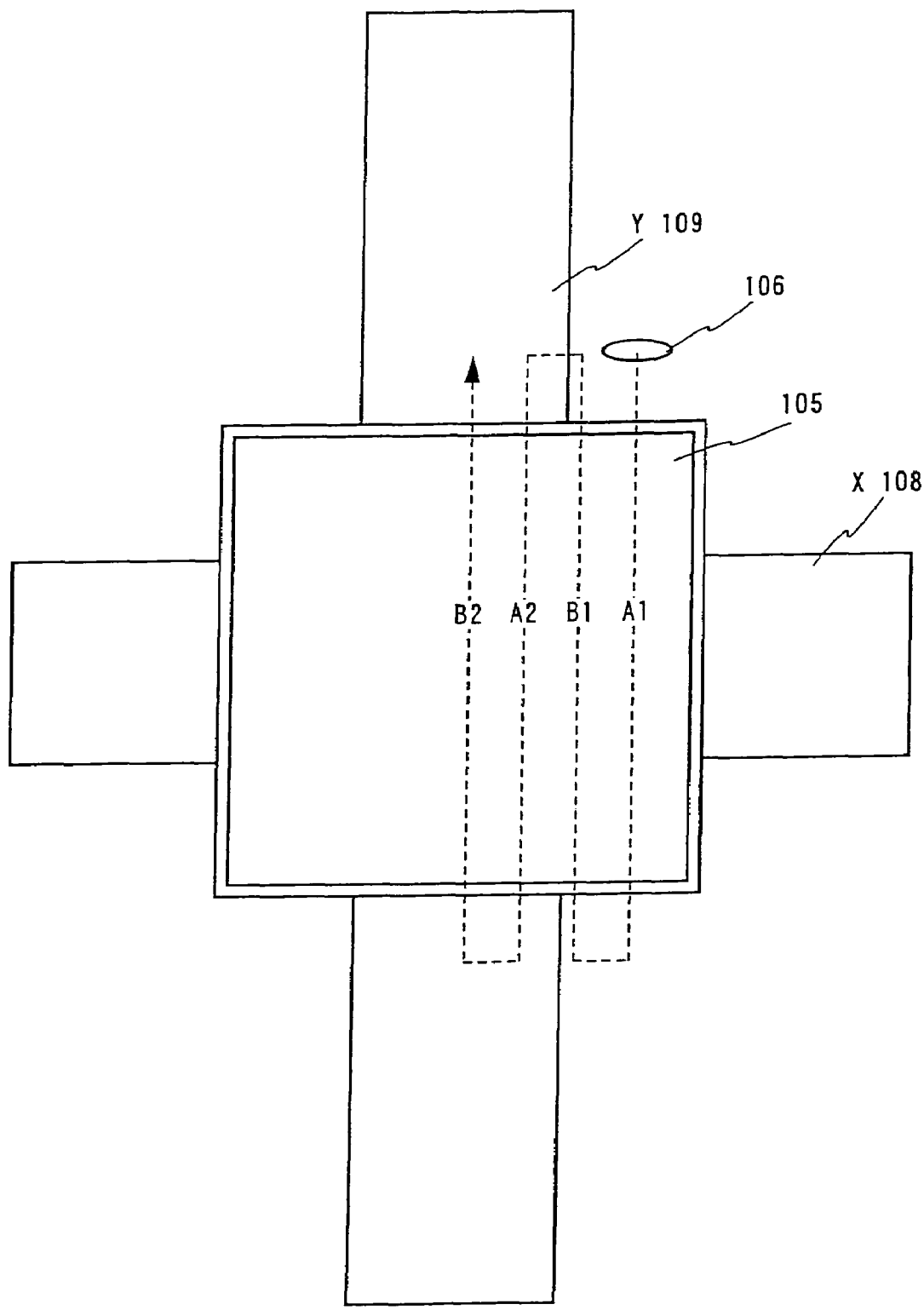
FIG. 6 is a view illustrating the laser annealing.

FIG. 6 illustrates a method of irradiation with the whole surface of the semiconductor film as a region of long crystalline particles. To facilitate the identification, reference numerals in the drawing are the same as those of FIG. 1. The substrate on which the semiconductor film is formed is secured onto the adsorption stage 107, and the laser oscillator 101 is oscillated. The output is set to be 5.5 watts, and the surface of the semiconductor film is scanned one line by the Y-axis robot 109 at a scanning speed of 50 cm/s. The one line corresponds to a portion Al in FIG. 6. In FIG. 6, the portion of outward trip Am (m is a positive integer) is irradiated with the laser by using the Y-axis robot. The oval beam is, then, slid by the X-axis robot 108 by the width of the region of long crystalline particles in the direction of long diameter, and the portion of return trip Bm is irradiated with the laser. Here, since the angle φ of incidence of the laser beam on the surface of the semiconductor film is not 0°, it is not allowed in this state to irradiate the surfaces of the outward trip and the return trip under the same condition. At a moment when the outward trip Am is shifted to the return trip Bm, therefore, the cylindrical lens 104 is moved in parallel from a position shown in FIG. 4A to a position shown in FIG. 4B so that the same irradiation condition is established for the outward trip and for the return trip. Namely, the internal product of the unit vector in the direction of incidence of the laser beam upon the substrate and the unit vector in the moving direction of the substrate, is rendered to be constant. Though not illustrated, this operation is automatically carried out by using a drive mechanism which accomplishes a parallel motion. By repeating a series of these operations, the whole surface of the semiconductor film becomes the region of the long crystalline particles. The semiconductor film in the region of the long crystalline particles exhibits a very high degree of properties and it is expected that a particularly high electric mobility is exhibited when a semiconductor element such as TFT is fabricated. The region of the long crystalline particles needs not be formed in the portions of the semiconductor film where such a high degree of properties are not required. Therefore, such portions are not irradiated with the laser beam or are irradiated with a laser beam which does not contribute to forming the region of the long crystalline particles.

EMBODIMENTS

Embodiment 1

Figure 5A:
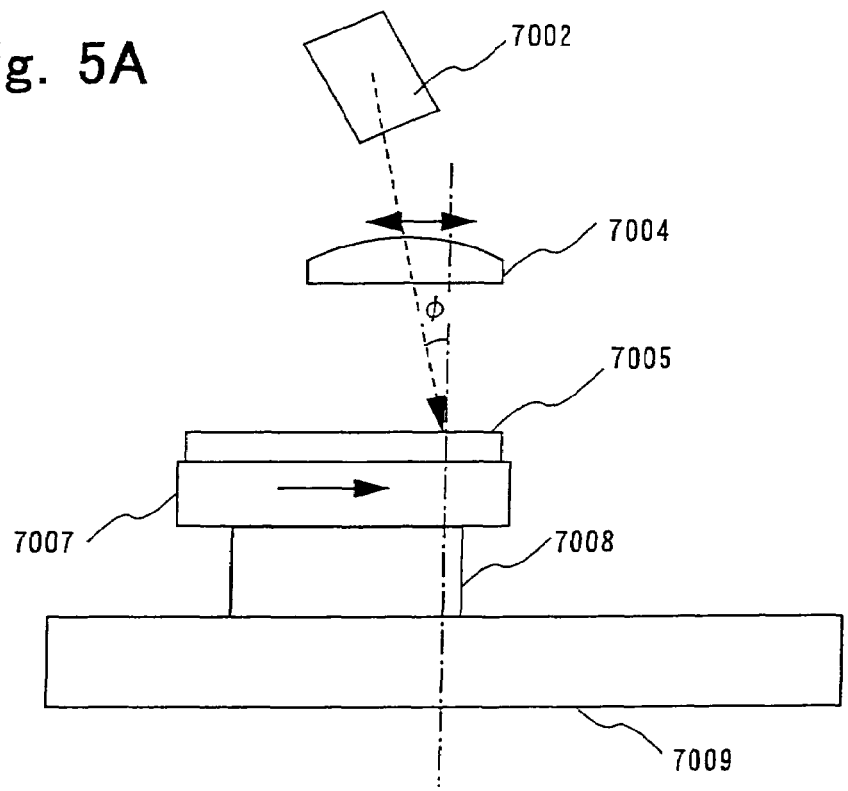
FIGS. 5A, B are views illustrating an apparatus for irradiating a laser beam.
Figure 7:
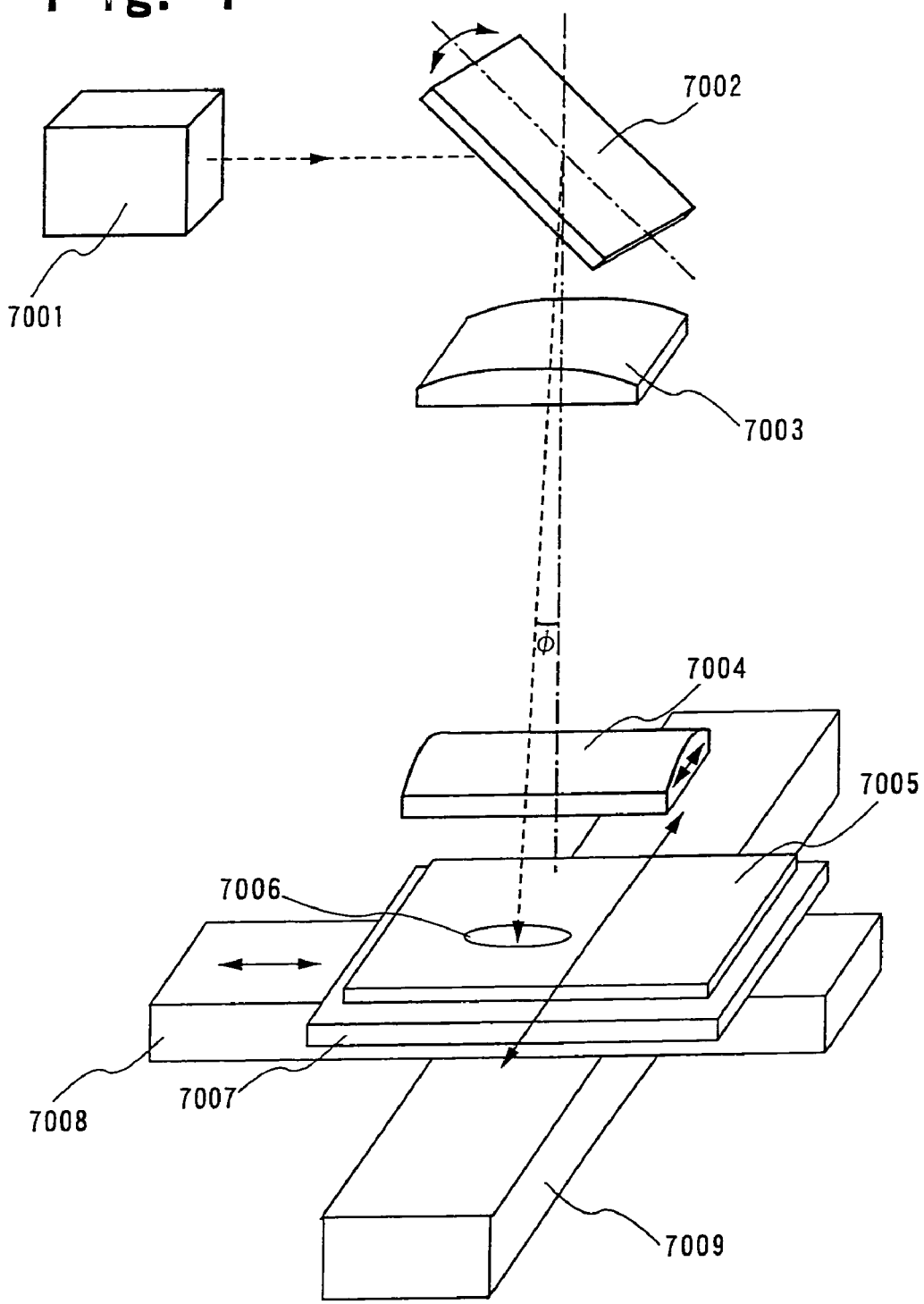
FIG. 7 is a view illustrating the first embodiment.

An example for putting the invention into practice relying upon another method will be described with reference to FIGS. 7 and 5A, B. In this embodiment, an oval beam 7006 is formed and with which the surface 7005 of the semiconductor film is irradiated.

First, a 10-watt laser oscillator 7001 (Nd:YVO$_4$ laser, CW, second harmonics) of the LD excitation type is provided. The laser oscillator is of the TEM00 oscillation mode incorporating an LBO crystal in the resonator, and is converted into second harmonics. The beam diameter is 2.25 mm, and the broadening angle is about 0.3 mrad. The direction of travel of the laser beam is converted into a direction deviated by several degrees from the vertical direction by a 45° reflection mirror 7002 on which a rotary mechanical portion that is not shown is mounted. Next, in order that the oval beam assumes a long diameter of about 500 µm on the surface of the semiconductor film 7005, the laser beam is permitted to fall on a flat/convex cylindrical lens 7003 having a focal distance of 150 mm. Here, the flat portion and the horizontal plane of the flat/convex cylindrical lens 7003 are maintained in parallel with each other. The angle of several degrees is put on a plane that includes the direction perpendicular to a generating line of the cylindrical lens 7003. Further, a flat/convex cylindrical lens 7004 having a focal distance of 20 mm is disposed at a position 100 mm under the cylindrical lens 7003. Here, the flat portion and the horizontal plane of the flat/convex cylindrical lens 7004 are maintained in parallel with each other. The length of the short diameter of the oval beam 7006 is controlled by the cylindrical lens 7004. Theoretically, the short diameter W becomes about 6 µm in this system. To increase the focal depth, the beam waist of the laser beam focused by the cylindrical lens 7004 should be brought to the surface of the semiconductor film 7005. The cylindrical lenses 7003 and 7004 are so arranged that their generating lines are at right angles with each other. In the cylindrical lens 7004 as shown in FIGS. 5A, B, the laser beam is incident at a position which is at the center of the cylindrical lens 7004. Since the direction of travel of the laser beam has been deviated from the vertical direction due to a 45° reflection mirror 7002, the angle of incidence of the laser beam on the surface of the semiconductor film 7005 becomes φ ($\neq 0°$).

The substrate on which the semiconductor film is formed and which is arranged on the adsorption stage 7007, is the one obtained by the method of the invention. Therefore, the angle φ of incidence may be at least 2°. The conditions for the laser beam irradiation may be the same as those of the embodiment mode of the invention.

Figure 5B:
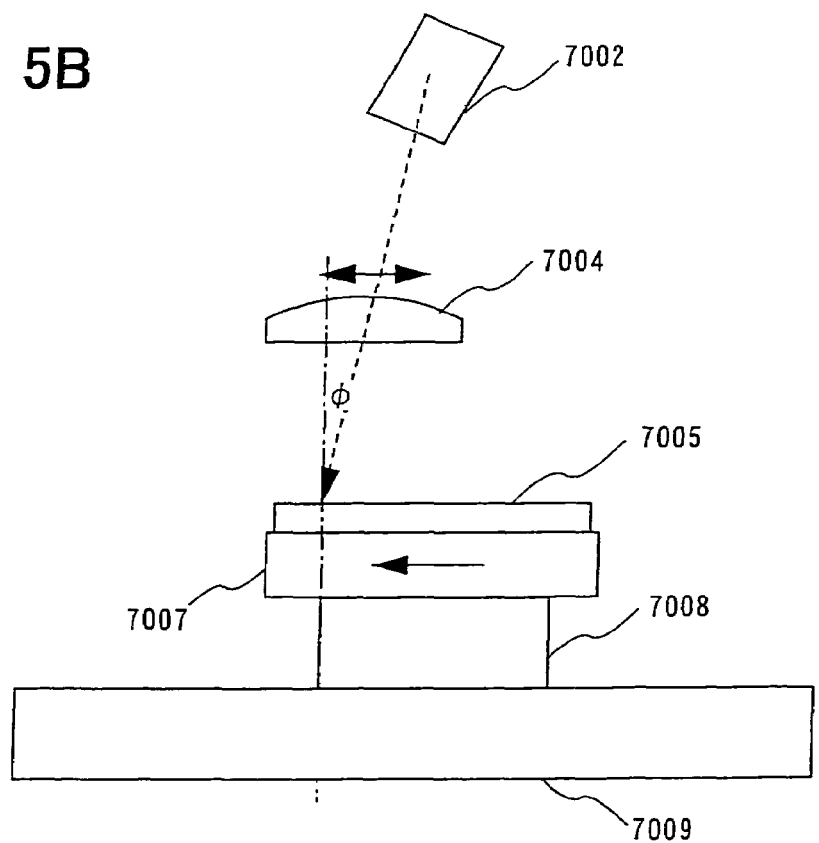
Figure 8:
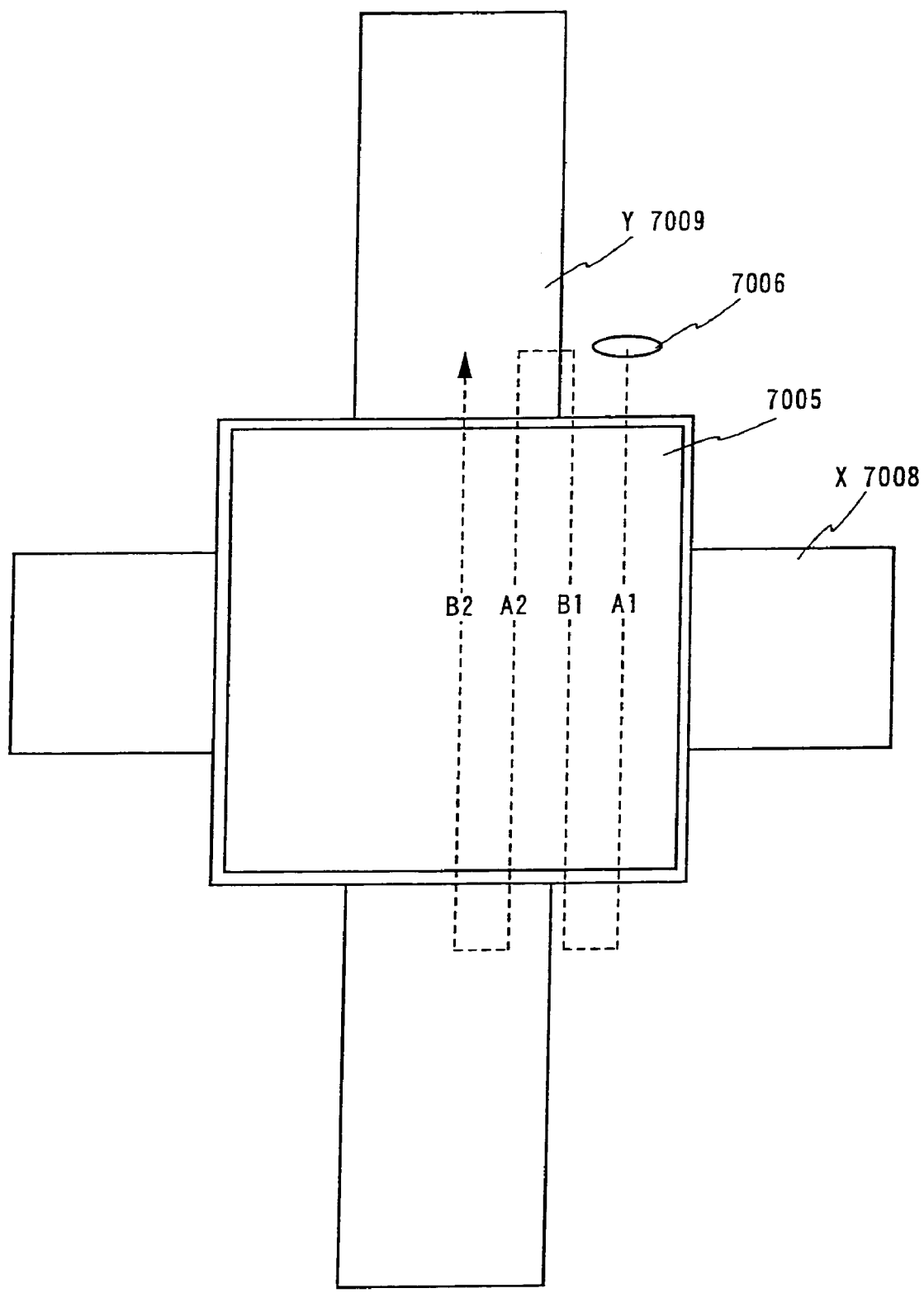
FIG. 8 is a view illustrating the laser annealing.

FIG. 8 illustrates a method of irradiation with the whole surface of the semiconductor film as a region of long crystalline particles. To facilitate the identification, reference numerals in the drawing are the same as those of FIG. 7. The substrate on which the semiconductor film is formed is secured onto the adsorption stage 7007, and the laser oscillator 7001 is oscillated. The output is set to be 5.5 watts, and the surface of the semiconductor film is scanned one line by the Y-axis robot 7009 at a scanning speed of 50 cm/s. The one line corresponds to a portion Al in FIG. 8. In FIG. 8, the portion of outward trip Am (m is a positive integer) is irradiated with the laser by using the Y-axis robot. The oval beam is, then, slid by the X-axis robot 7008 by the width of the region of long crystalline particles in the direction of long diameter, and the portion of return trip Bm is irradiated with the laser. Here, since the angle φ of incidence of the laser beam on the surface of the semiconductor film is not 0°, it is not allowed in this state to irradiate the surfaces of the outward trip and the return trip under the same condition. At a moment when the outward trip Am is shifted to the return trip Bm, therefore, the angle of the 45° reflection mirror 7002 is changed and the cylindrical lens 7004 is moved in parallel from a position shown in FIG. 5A to a position shown in FIG. 5B so that the same irradiation condition is established for the outward trip and for the return trip. Though not illustrated, this operation is automatically carried out by using a drive mechanism which accomplishes a parallel motion. By repeating a series of these operations, the whole surface of the semiconductor film becomes the region of the long crystalline particles. The semiconductor film in the region of the long crystalline particles exhibits a very high degree of properties and it is expected that a particularly high electric mobility is exhibited when a semiconductor element such as TFT is fabricated. The region of the long crystalline particles needs not be formed in the portions of the semiconductor film where such a high degree of properties are not required. Therefore, such portions are not irradiated with the laser beam or are irradiated with a laser beam having such an energy density which does not contribute to forming the region of the long crystalline particles.

Embodiment 2

Figure 2A:
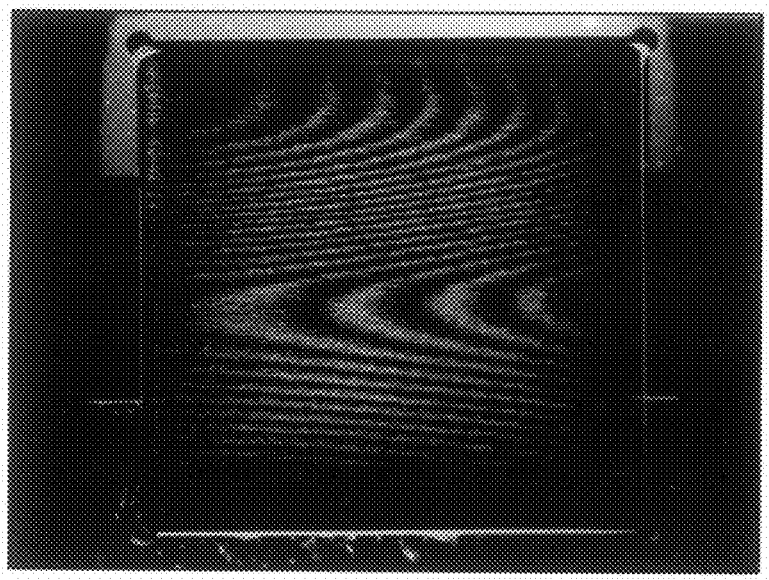
FIGS. 2A, B are diagrams illustrating interference patterns recorded on a semiconductor film explaining a second embodiment.

Interference recorded on the semiconductor film of when the angle φ of incidence is set to 0° will be described with reference to FIGS. 2A, B in the optical system shown in FIG. 1.

Figure 2B:
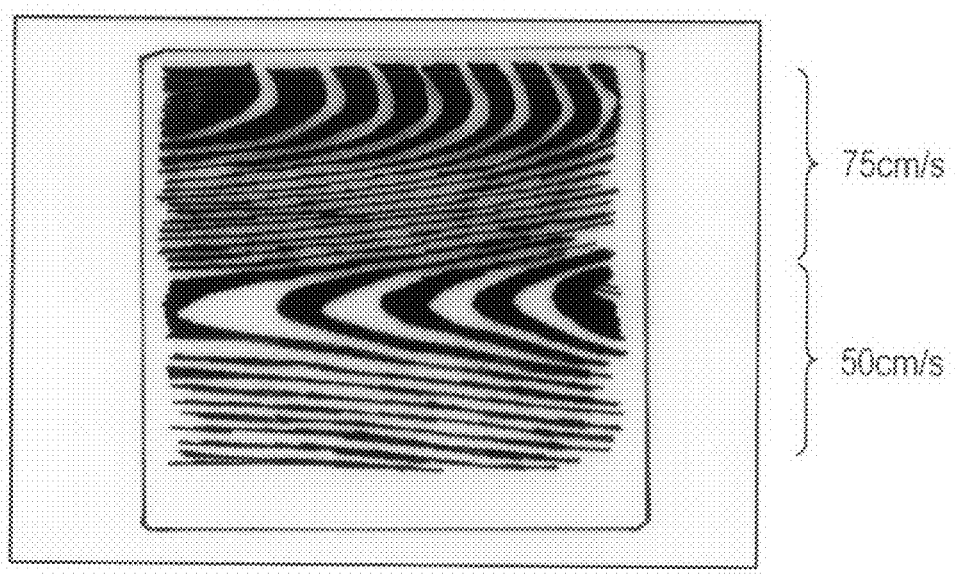

The irradiation conditions are the same as those conditions of the embodiment mode of the invention but the scanning only is effected at two speeds of 50 cm/s and 75 cm/s. FIG. 2A is a photograph where the upper half is irradiated at 75 cm/s and the lower half is irradiated at 50 cm/s. When the whole surface of the semiconductor film is uniformly irradiated with an oval beam as in the embodiment mode of the invention, grained interference fringes are clearly recorded on the semiconductor film. FIG. 2B illustrates a picture emphasizing interference fringes. In FIGS. 2A, B, the upper half and the lower half are scanned with the oval beam at different scanning speeds. However, the interference fringes are the same irrespective of at which speeds the irradiation is effected.

Interference fringes are caused by the heating of the semiconductor film by using the laser beam which is transparent to the semiconductor film and is further transparent to the substrate on which the semiconductor film is formed. The semiconductor film has a thickness smaller than the wavelength of the laser beam. Therefore, interference little takes place between the light reflected by the surface of the semiconductor film and the light reflected by the interface of the semiconductor film and the insulating film that is formed between the semiconductor film and the glass substrate. However, it is very probable that the interference is caused by the light reflected by the surface of the semiconductor film and by the light reflected by the back surface of the substrate. Interference fringes seen in FIGS. 2A, B are caused as described above. Patterns are irregular since the substrate is irregularly distorted. If the substrate has the shape of a dish, then, the fringes will assume a concentric pattern. This pattern is intimately related to the properties of the semiconductor film. From the above experimental results, the irradiation of a laser beam at an angle of incidence of 0° results in the formation of the semiconductor film having an irregular profile of properties. Therefore, falling the laser beam at an angle φ of incidence which is not 0 plays an important rile for obtaining a semiconductor film having homogeneous properties.

Embodiment 3

Difference in the record on the semiconductor film depending upon the outward trip and the return trip will be described with reference to FIGS. 3A, B when the angle φ of incidence is set to be several degrees and the position of the cylindrical lens 104 is fixed in the optical system shown in FIG. 1.

The irradiation conditions are the same as those conditions of the embodiment mode of the invention. FIG. 3A is a photograph of an a-Si film of when irradiated with the scanning speed of 50 cm/s. In the photograph, the left side is the outward trip and the right side is the return trip. The scanning is effected in the up-and-down direction in the photograph, a region of thick lines at the center of the photograph is the region of the long crystalline particles, the regions that look thin on both sides thereof are polycrystalline regions where crystalline particles having a small aspect ratio are collected, and regions of fine crystals (microcrystals) are existing on the extreme outer sides thereof. Differences in these regions are caused since the laser beam has an energy profile close to the Gaussian profile. A distinct difference is seen in the width of the region of the long crystalline particles depending upon the outward trip and the return trip. This is undesirable particularly when the regularly arranged semiconductor elements are irradiated with the laser beam by the above irradiation method. The outer sides of the region of the long crystalline particles exhibit properties different from those of the region of the long crystalline particles. Therefore a difference that occurs depending upon the outward trip and the return trip is not desirable when it is desired to obtain regularly arranged homogeneous semiconductor elements. This is due to that since the angle φ of incidence is not 0, the relationship between the outward trip and the return trip is not inverted.

FIG. 3B is a photograph of a p-Si film irradiated at a scanning speed of 100 cm/s. The scanning direction is in the up-and-down direction of the photograph. The left side of the photograph is the outward trip and the right side is the return trip. The p-Si film is thermally crystallized by using metal nickel but has a pattern obviously different from that of the a-Si film that is irradiated. This is due to a difference in the coefficient of absorption of light between the a-Si film and the p-Si film, and it is further presumed that the presence of a metal element is taking part in. In the above photograph, the outward trip is irradiated with the laser beam without problem but the return trip includes many lines in a direction perpendicular to the scanning direction forming defects in the crystals. Such a defect turns out to be a dispersion in the characteristics of the semiconductor element causing a leakage of current, which is not desirable. Thus, a difference appears depending upon the outward trip and the return trip even when the p-Si film is irradiated with the laser beam by scanning the CW laser.

In the above scanning, the cause of difference between the outward trip and the return trip stems from the difference in the angle of incidence of the laser beam. Therefore, the feature of the invention is obtained even when the substrate does not permit the laser beam to pass through. When the substrate does not permit light to pass through, however, no interference fringe is formed, and it is allowed to set the angle of incidence to be 0°. In this case, therefore, the present invention needs not be applied. In the step of crystallizing the semiconductor film by using the laser, however, it is a main stream to use, as the substrate, a glass which permits visible light to pass through. Therefore, limitation will be imposed when it is attempted to utilize the above step while maintaining the angle of incidence of the laser beam at 0°.

Embodiment 4

A method of manufacturing an active matrix substrate is explained in this embodiment using FIGS. 9 to 12. A substrate on which a CMOS circuit, a driver circuit, and a pixel portion having a pixel TFT and a holding capacity are formed together is called active matrix substrate for convenience.

First, a substrate 400 made from glass such as barium borosilicate glass or aluminum borosilicate glass is used in this embodiment. Note that substrates such as quartz substrates, silicon substrates, metallic substrates, and stainless steel substrates having an insulating film formed on the substrate surface may also be used as the substrate 400. Further, a plastic substrate having heat resisting properties capable of enduring the processing temperatures used in this embodiment may be used, and a flexible substrate may also be used. Because this invention can easily form a linear beam with a uniform energy distribution, it is possible that annealing the large area substrate is conducted effectively by using a plurality of linear beams.

Next, a base film 401 made from an insulating film such as a silicon oxide film, a silicon nitride film, or a silicon oxynitride film is then formed on the substrate 400 by the known method. A two layer structure is used as the base film 401 in this embodiment, but a single layer of the above-mentioned insulating film may also be used, and a structure in which more than two layers are laminated may also be used.

Next, semiconductor layers are formed on the base film. First of all, semiconductor film is formed with a thickness of 25 to 200 nm (preferably 30 to 150 nm) by a known method (such as the sputtering method, the LPCVD method, and the plasma CVD method). Then, the semiconductor film is crystallized by a laser crystallization method. As the laser crystallization method, the laser beam irradiates to the semiconductor film by applying one of Embodiment Mode and Embodiment 1 or by freely combining with these Embodiments. It is preferable that a solid-state laser, a gas laser or metallic laser of continuous oscillation is used. Note that, as the solid-state laser, there may be given a YAG laser, a $YVO_4$ laser, a YLF laser, a $YAlO_3$ laser, a glass laser, a ruby laser, an alexandrite laser, a Ti:sapphire laser, and the like of continuous oscillation. As a the gas laser, there may be given a KrF excimer laser, Ar laser, Kr laser, $CO_2$ laser, and the like of continuous oscillation. And as the metallic laser, there may be given a helium cadmium laser, a copper vapor laser, or a gold vapor laser. Of course, not only the laser crystallization method but also any other known crystallization method (such as RTA, the thermal crystallization method using a furnace annealing, the thermal crystallization method using metallic elements which promote crystallization) may also be combined. The semiconductor film may be an amorphous semiconductor film, a microcrystal semiconductor film or a crystalline semiconductor film. Alternatively, the semiconductor film may be a compound semiconductor film having an amorphous structure such as an amorphous silicon germanium film and an amorphous silicon carbide film.

In this embodiment, plasma CVD method is used to form an amorphous silicon film with a thickness of 50 nm, and then the thermal crystallization method using metallic elements, which promote crystallization, and laser crystallization method are used for the amorphous silicon film. Nickel is used as a metal element, and is introduced onto the amorphous silicon film by a solution coating method. Then heat treatment is conducted at 550° C. for five hour, whereby obtaining a first crystalline silicon film. Subsequently, the laser beam shot from a continuous oscillation Nd: $YVO_4$ laser with output 10 W is converted into the second higher harmonic wave by a nonlinear optical element, whereby obtaining a second crystalline silicon film in accordance with Embodiment 1. Irradiating the laser beam to the first crystalline silicon film, and changing the first crystalline silicon film to the second crystalline silicon film improve the crystallinity of the second crystalline silicon film. At this moment, about 0.01 to 100 $MW/cm^2$ (preferably 0.1 to 10 $MW/cm^2$) is necessary for the energy density. The stage is relatively moved to the laser beam at a speed of about 0.5 to 2000 cm/s, and it irradiates, and then the crystalline silicon film is formed. As shown in FIG. 3, although a uniform and excellent crystalline semiconductor film is formed in the vicinity of the center of the laser beam, crystalline semiconductor films having different characteristics are formed at both ends of the laser beam. So as not to form the semiconductor elements at such a position, the laser beam may be irradiated to the predetermined area that the position of the substrate is decided previously. When a TFT is formed by using the second crystalline silicon film, the mobility is extremely improved with about 500 to 660 $cm^2/Vs$.

The semiconductor layers 402 to 406 are formed by performing patterning processing on thus obtained semiconductor film by using the photolithography method.

Doping of a very small amount of an impurity element (boron or phosphorous) may be performed after forming the semiconductor layers 402 to 406 in order to control a threshold value of TFT.

A gate insulating film 407 is formed next, covering the semiconductor layers 402 to 406. The gate insulating film 407 is formed by an insulating film containing silicon with a thickness of 40 to 150 nm using plasma CVD or sputtering. In this embodiment, a silicon oxynitride film having a film thickness of 110 nm is formed by plasma CVD method. The gate insulating film is of course not limited to a silicon oxynitride film, and other insulating films may be used in a single layer or in a lamination structure.

Further, if a silicon oxide film is used, it can be formed by plasma CVD method with a mixture of TEOS (Tetraethyl Orthosilicate) and $O_2$, at a reaction pressure of 40 Pa, with the substrate temperature set from 300 to 400° C., and by discharging at a high frequency (13.56 MHz) electric power density of 0.5 to 0.8 $W/cm^2$. Good characteristics as a gate insulating film can be obtained by subsequently performing thermal annealing, at between 400 and 500° C., of the silicon oxide film thus manufactured.

A first conductive film 408 having a film thickness of 20 to 100 nm, and a second conductive film 409 having a film thickness of 100 to 400 nm are then formed and laminated on the gate insulating film 407. The first conductive film 408, made from a TaN film having a film thickness of 30 nm, and the second conductive film 409, made from a W film having a film thickness of 370 nm, are formed and laminated in this embodiment. The TaN film is formed by sputtering, and sputtering of a Ta target is performed in a nitrogen atmosphere. Further, the W film is formed by sputtering using a W target. In addition, the W film can also be formed by thermal CVD method using tungsten hexafluoride ($WF_6$). Whichever is used, it is necessary to be able to make the film become low resistance in order to use it as a gate electrode, and it is preferable that the resistivity of the W film be made less than 20 $\mu\Omega$cm.

Note that although the first conductive film 408 is TaN and the second conductive film 409 is W in this embodiment, there are no particular limitations placed on the conductive films. The first conductive film 408 and the second conductive film 409 may also be formed from an element selected from the group consisting of Ta, W, Ti, Mo, Al, Cu, Cr, and Nd, or from an alloy material having one of these elements as its main constituent, or from a chemical compound of these elements. Further, a semiconductor film, typically a polycrystalline crystalline silicon film, into which an impurity element such as phosphorous is doped may also be used, as may an AgPdCu alloy.

Masks 410 to 415 are formed next from resist using a photolithography method, and a first etching process is performed in order to form electrodes and wirings. The first etching processing is performed in accordance with first and second etching conditions (FIG. 9B). An ICP (Inductively Coupled Plasma) etching method is used as a first etching condition in this embodiment. A gas mixture of $CF_4$, $Cl_2$, and $O_2$ is used as an etching gas, the gas flow rates are set to 25:25:10 (sccm), respectively, a plasma is generated by supplying a 500 W RF (13.56 MHz) electric power to a coil shape electrode at a pressure of 1 Pa, and etching is performed. A 150 W RF (13.56 MHz) electric power is also applied to the substrate side (sample stage), thereby applying a substantially negative self-bias voltage. The W film is etched under the first etching conditions, and the edge portion of the first conductive layer is made into a tapered shape.

The etching conditions are changed to a second etching condition without removing the masks 410 to 415 made of resist. A gas mixture of $CF_4$ and $Cl_2$ is used as an etching gas, the gas flow rates are set to 30:30 (sccm), respectively, a plasma is generated by applying a 500 W RF (13.56 MHz) electric power to a coil shape electrode at a pressure of 1 Pa, and etching is performed for approximately 30 seconds. A 20 W RF (13.56 MHz) electric power is also supplied to the substrate side (sample stage), thereby applying a substantially negative self-bias voltage. The W film and the TaN film are both etched by on the same order by the second etching conditions using the gas mixture of $CF_4$ and $Cl_2$. Note that the etching time may be increased at the rate of about 10 to 20% in order to perform etching such that no residue remains on the gate insulating film.

Edge portions of the first conductive layer and the second conductive layer are made into a tapered shape in accordance with the effect of a bias voltage, applied to the substrate side, by making the shapes of the masks made of resist suitable with the above-mentioned first etching condition. The angle of the tapered portions is from 15 to 45°. First shape conductive layers 417 to 422 (first conductive layers 417a to 422a, and second conductive layers 417b to 422b) are thus formed from the first conductive layers and the second conductive layers by the first etching process. Reference numeral 416 denotes a gate insulating film, and regions not covered by the first shape conductive layers 417 to 422 become thinner by approximately 20 to 50 nm through etching.

A second etching process is then performed without removing the masks made of resist (FIG. 9C). Here, W film is selectively etched by using $CF_4$, $Cl_2$, and $O_2$ for the etching gas. At this time, the second conductive layers 428b to 433b are formed by the second etching process. On the other hand, the first conductive layers 417a to 422a are hardly etched and the second shape conductive layers 428 to 433 are formed.

A first doping process is then performed without removing the masks made of resist and the semiconductor layer is added to the impurity element which imparts n-type at a low concentration. The doping process may be performed by ion doping method or ion injection method. Ion doping is performed with process conditions in which the dosage is set from $1\times10^{13}$ to $5\times10^{14}/cm^2$, and the acceleration voltage is set between 40 to 80 keV. Doping is performed in this embodiment with the dosage set to $1.5\times10^{13}/cm^2$, and the acceleration voltage set to 60 keV. An element belonging to the group 15, typically phosphorous (P) or arsenic (As) is used as an impurity element which imparts n-type. Phosphorous (P) is used here. In this case the conductive layers 428 to 433 act as masks with respect to the impurity element which imparts n-type conductivity, and the impurity regions 423 to 427 are formed in a self-aligning manner. The impurity element which imparts n-type is added to the impurity regions 423 to 427 at a concentration in a range of $1\times10^{18}$ to $1\times10^{20}/cm^3$.

Figure 10A:
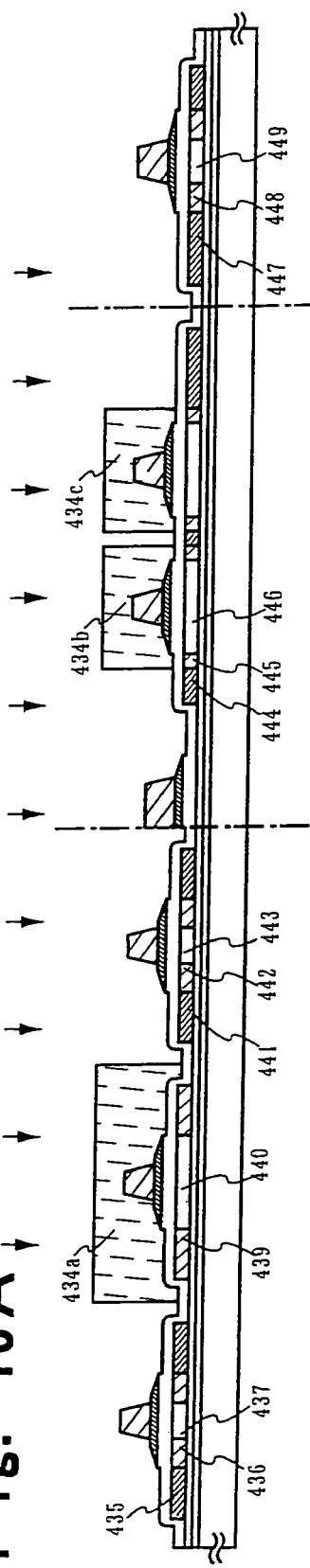
FIGS. 10A, B and C are sectional views illustrating the steps of fabricating pixel TFTs and drive circuit TFTs.

Next, after removing the masks made of resist, new masks 434a to 434c made of resist are formed, and the second doping process is performed in higher acceleration voltage than the first doping process. Ion doping is performed with process conditions in which the dosage is set from $1\times10^{13}$ to $1\times10^{15}/cm^2$, and the acceleration voltage is set between 60 to 120 keV. The doping process is performed by using the second conductive layers 428b to 432b as masks and the semiconductor layer under the tapered portion of the first conductive layer is added to the impurity element. Continuously the acceleration voltage is lowered than the second doping process, the third doping process is done, and the state of FIG. 10A is obtained. Ion doping method is performed with process conditions in which the dosage is set from $1\times10^{15}$ to $1\times10^{17}/cm^2$, and the acceleration voltage is set between 50 to 100 keV. Low concentration impurity regions 436, 442 and 448 overlapping with the first conductive layer are added to the impurity element, which imparts n-type within the range of the density of $1\times10^{18}$ to $5\times10^{19}/cm^2$ by the second doping process and the third doping process and high concentration impurity regions 435, 441, 444 and 447 are added to the impurity element, which imparts n-type within the range of the density of $1\times10^{19}$ to $5\times10^{21}/cm^2$.

Of course, the second doping process and the third doping process can be one-time doping processes by making it to a suitable acceleration voltage and it is also possible to form the low concentration impurity region and high concentration impurity region.

Figure 10B:
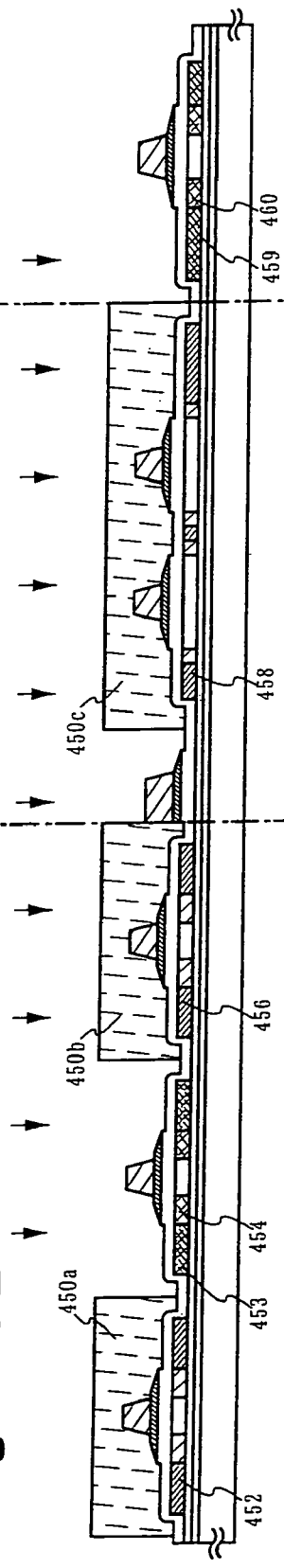
Figure 10C:
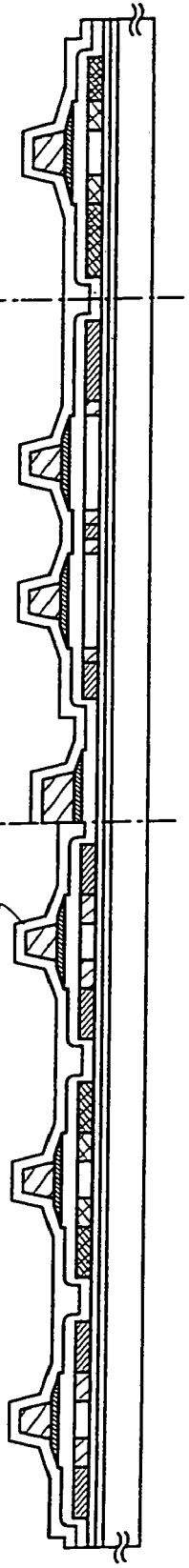

Next, after removing the masks made of resist, new masks 450a to 450c made from resist are formed and the fourth doping process is performed. Impurity regions 453, 454, 459 and 460, to which an impurity element which imparting a conductivity type opposite to that of the above one conductivity type is added, are formed in accordance with the fourth doping process in the semiconductor films which become active layers of the p-channel TFTs. The second conductive layers 429a to 432a are used as masks with respect to the impurity element, and an impurity element which imparts p-type conductivity is added to form the impurity regions in a self-aligning manner. The impurity regions 453, 454, 459 and 460 are formed by ion doping method using diborane ($B_2H_6$) in this embodiment (FIG. 10B). The semiconductor layers for forming the n-channel TFT are covered with the masks 450a to 450c made of resist when the fourth doping process is performed. Phosphorous is added at different concentrations into the impurity regions 439, 447 and 448 by the first to third doping processes. However, by performing doping such that the concentration of the impurity element which imparts p-type conductivity becomes from $1\times10^{19}$ to $5\times10^{21}$ atoms/$cm^3$ in the respective regions, no problems develop in making the regions function as source regions and drain regions of the p-channel TFT.

The impurity regions are thus formed in the respective semiconductor layers by the steps up through this point.

A first interlayer insulating film 461 is formed next after removing the masks 450a to 450c made of resist. This first interlayer insulating film 461 is formed from an insulating film containing silicon, having a thickness of 100 to 200 nm, by using plasma CVD method or sputtering method. A silicon oxynitride film having a thickness of 150 nm is formed by plasma CVD method in this embodiment. The first interlayer insulating film 461 is of course not limited to a silicon oxynitride film, and other insulating films containing silicon may also be used, as a single layer or a lamination structure.

Subsequently, a recovery of the crystallinity of the semiconductor layer and an activation of the impurity elements added to the respective semiconductor layers are performed by irradiating the laser beam. As the laser activation, the laser beam irradiates to the semiconductor film by applying one of Embodiment Mode and Embodiment 1 or by freely combining with these embodiments, or by the other method. When the present invention is utilized in this process, a uniform and excellent crystalline semiconductor film is formed in the vicinity of the center of the laser beam as shown in FIG. 3. However, crystalline semiconductor films having different characteristics are formed at both ends of the laser beam. So as not to form the semiconductor elements at such position, the laser beam may be irradiated to the predetermined area that the position of the substrate is decided previously.

It is preferable that a solid-state laser, a gas laser, or metallic laser of a continuous oscillation or a pulse oscillation is used. Note that, as the solid-state laser, there may be given a YAG laser, a $YVO_4$ laser, a YLF laser, a $YAlO_3$ laser, a glass laser, a ruby laser, an alexandrite laser, a Ti:sapphire laser, and the like of a continuous oscillation or a pulse oscillation. As a the gas laser, there may be given a KrF excimer laser, Ar laser, Kr laser, $CO_2$ laser, or the like of continuous oscillation or pulse oscillation. And as the metallic laser, there may be given a helium cadmium laser, a copper vapor laser, or a gold vapor laser of continuous oscillation or pulse oscillation. At this moment, if a continuous oscillation laser is used, about 0.01 to 100 MW/$cm^2$ (preferably 0.01 to 10 MW/$cm^2$) is necessary for the energy density of laser beam. The substrate is relatively moved to the laser beam at a speed of about 0.5 to 2000 cm/s. And, if a pulse oscillation laser is used, it is preferable that 50 to 1000 mj/$cm^2$ (typically, 50 to 500 mj/$cm^2$) of laser energy density are used. At this moment, laser beam may be overlapped by 50 to 98%. Besides laser annealing method, thermal annealing method or rapid thermal annealing method (RTA method) and the like can be applied.

Further, the activation may also be performed before the formation of a first interlayer insulating film. However, if the wiring material used is weak with respect to heat, then it is preferable to perform the activation processing after forming an interlayer insulating film (an insulating film having silicon as its main constituent, for example a silicon nitride film) in order to protect the wirings and the like, as in this embodiment.

Then, a heat treatment can also be performed (at 300 to 550° C. for 1 to 12 hours) and it is possible to conduct a hydrogenation. This process is one of terminating dangling bonds in the semiconductor layers by hydrogen contained within the first interlayer insulating film 461. The semiconductor layers can be hydrogenated whether or not the first interlayer insulating film exists. Plasma hydrogenation (using hydrogen excited by a plasma), and a heat treatment for 1 to 12 hours at a temperature of 300 to 450° C. in an atmosphere containing hydrogen of from 3 to 100% may also be performed as other means of hydrogenation.

Subsequently, a second interlayer insulating film 462 made from an inorganic insulating film material or from an organic insulating material is formed on the first interlayer insulating film 461. An acrylic resin film having a film thickness of 1.6 µm is formed in this embodiment, and the material used may have a viscosity from 10 to 1000 cp, preferably between 40 to 200 cp. A material in which unevenness is formed on its surface is used.

In order to prevent mirror reflection, the surface of a pixel electrode is made uneven by forming a second interlayer insulating film which forms an uneven surface in this embodiment. Further, the pixel electrode surface can be made to be uneven and have light scattering characteristics, and therefore a convex portion may also be formed in a region below the pixel electrode. The formation of the convex portion can be performed by the same photomask as that for forming the TFTs, and therefore it can be formed without increasing the number of process steps. Note that the convex portion may also be formed appropriately on the substrate of the pixel portion region except the wirings and TFTs. In this way, unevenness is formed in the surface of the pixel electrode along the unevenness formed in the surface of the insulating film which covers the convex portion.

A film having a level surface may also be used as the second interlayer insulating film 462. In this case, it is preferable that the surface be made uneven by an added process such as a known sandblasting process or etching process to prevent mirror reflection, and thereby increasing whiteness by scattering reflected light.

Figure 11:
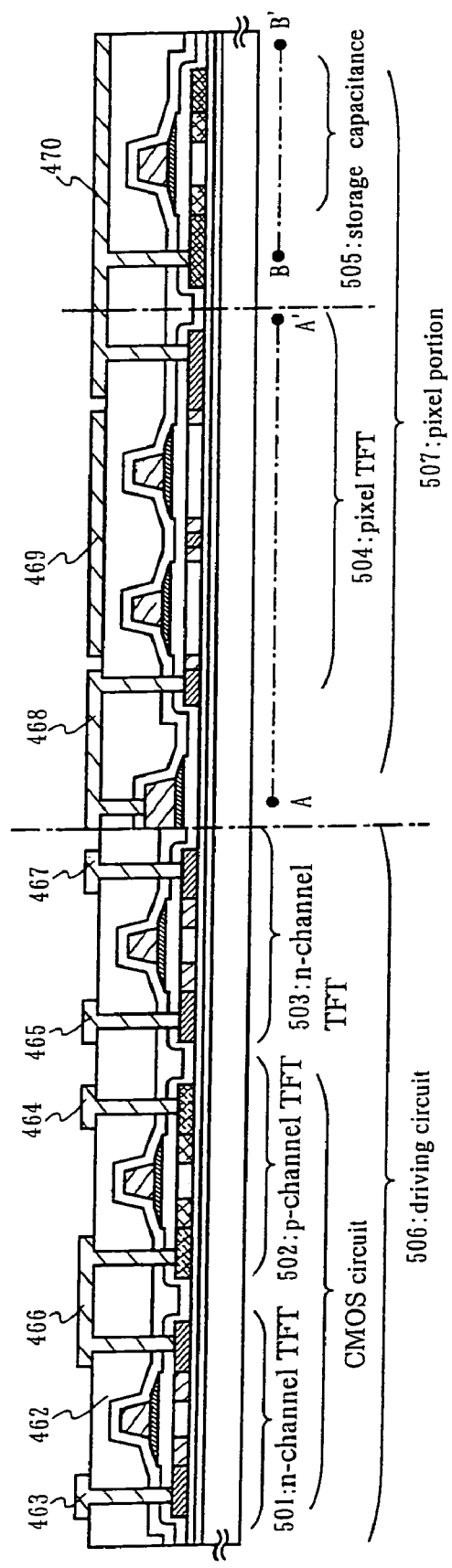
FIG. 11 is a sectional view illustrating the steps of fabricating pixel TFTs and drive circuit TFTs.

Wirings 463 to 468 for electrically connecting respective impurity regions are then formed in a driver circuit 506. Note that a lamination film of a Ti film having a thickness of 50 nm and an alloy film (an alloy film of Al and Ti) having a thickness of 500 nm is patterned in order to form the wirings. Of course, it is not limited to the two-layer structure, the single-layer structure or the lamination structure more than three layers may also be acceptable. Further, Al and Ti are not limited to the wiring material. For example, Al and Cu are formed on TaN film, and the lamination film forming the Ti film is formed by the patterning and form wiring (FIG. 11).

Further, a pixel electrode 470, a gate wiring 469, and a connection electrode 468 are formed in a pixel portion 507. An electrical connection is formed with the pixel TFT and the source wiring (lamination of 443a and 443b) by the connection electrode 468. Further, the gate wiring 469 forms an electrical connection with the gate electrode of the pixel TFT. The pixel electrode 470 forms an electrical connection with the drain region 442 of the pixel TFT, and in addition, forms an electrical connection with the semiconductor layer 458 which functions as one electrode forming a storage capacitor. It is preferable to use a material having superior reflectivity, such as a film having Al or Ag as its main constituent, or a lamination film of such films, as the pixel electrode 470.

A CMOS circuit composed of a n-channel TFT 501 and a p-channel TFT 502, a driver circuit 506 having an n-channel TFT 503, and the pixel portion 507 having a pixel TFT 504 and a storage capacitor 505 can thus be formed on the same substrate. The active matrix substrate is thus completed.

The n-channel TFT 501 of the driver circuit 506 has: a channel forming region 437; the low concentration impurity region 436 (GOLD region) which overlaps with the first conductive layer 428a that structures a portion of the gate electrode; and the high concentration impurity region 452 which functions as a source region or a drain region. The p-channel TFT 502, which forms the CMOS circuit by connecting the n-channel TFT 501 and the electrode 466 has: a channel forming region 440; a high concentration impurity region 453 which functions as a source region or a drain region; and a impurity region 454 in which the impurity element imparting p-type is introduced. Further, the n-channel TFT 503 has: a channel forming region 443; the low concentration impurity region 442 (GOLD region) overlaps with the first conductive layer 430a that structures a portion of the gate electrode; and a high concentration impurity region 456 which functions as a source region or a drain region.

The pixel TFT 504 of the pixel portion has: a channel forming region 446; the low concentration impurity region 445 (LDD region) formed on the outside of the gate electrode; and the high concentration impurity region 458 which functions as a source region or a drain region. Further, an impurity element which imparts n-type and an impurity element which imparts p-type are added to the semiconductor layer which functions as one electrode of the storage capacitor 505. The storage capacitor 505 comprises an electrode (lamination of 432a and 432b) and the semiconductor layer, with the insulating film 416 functioning as a dielectric.

Edge portions of the pixel electrodes are disposed so as to overlap with source wirings such that gaps between the pixel electrodes shield the light, without using a black matrix, with the pixel structure of this embodiment.

Figure 12:
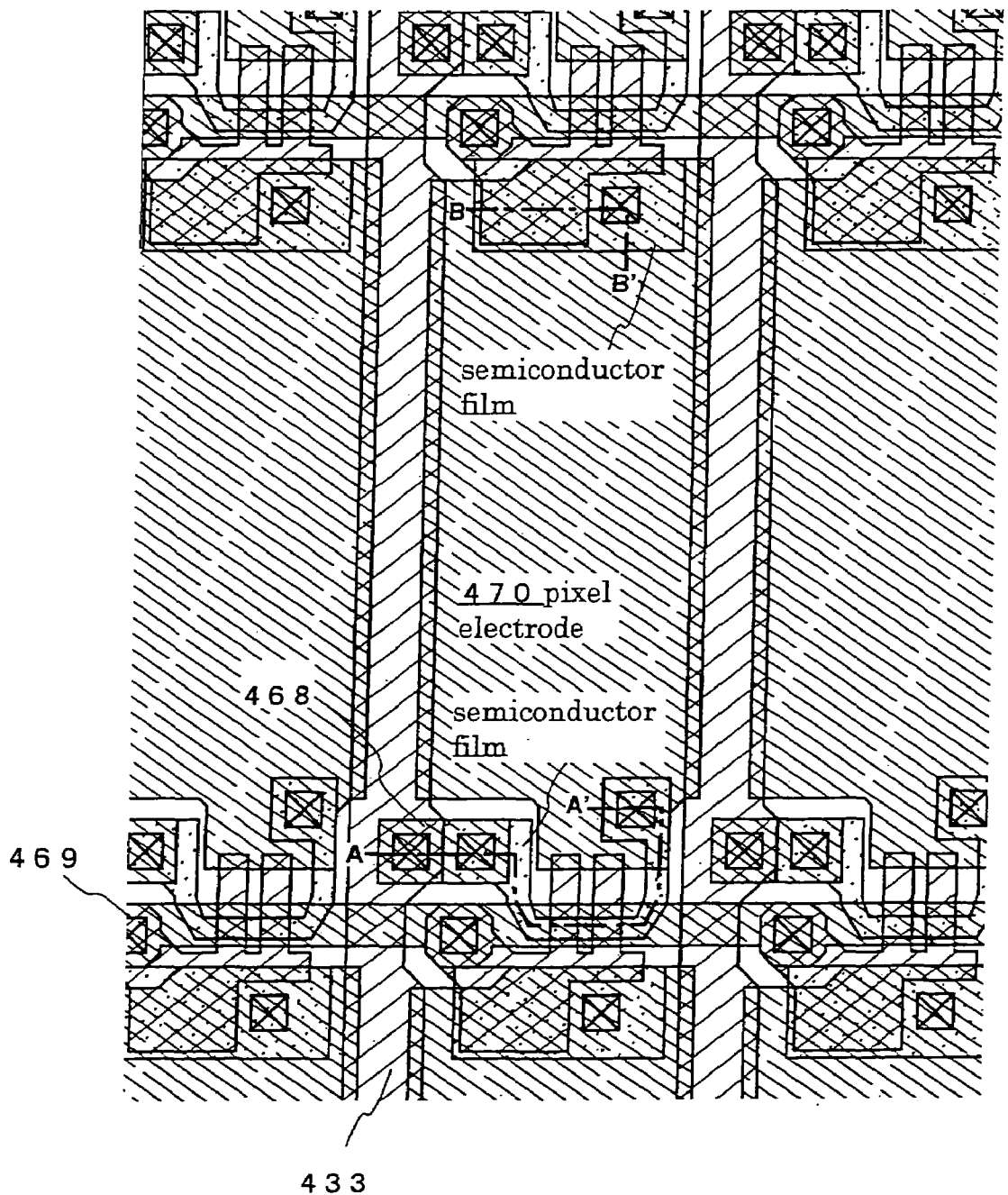
FIG. 12 is a top view illustrating the constitution of pixel TFTs.

An upper surface diagram of the pixel portion of the active matrix substrate manufactured in this embodiment is shown in FIG. 12. Note that the same reference symbols are used for portions corresponding to those in FIGS. 9 to 12. A chain line A-A' in FIG. 11 corresponds to a cross sectional diagram cut along a chain line A-A' within FIG. 12. Further, a chain line B-B' in FIG. 11 corresponds to a cross sectional diagram cut along a chain line B-B' within FIG. 12.

Embodiment 5

Figure 13:
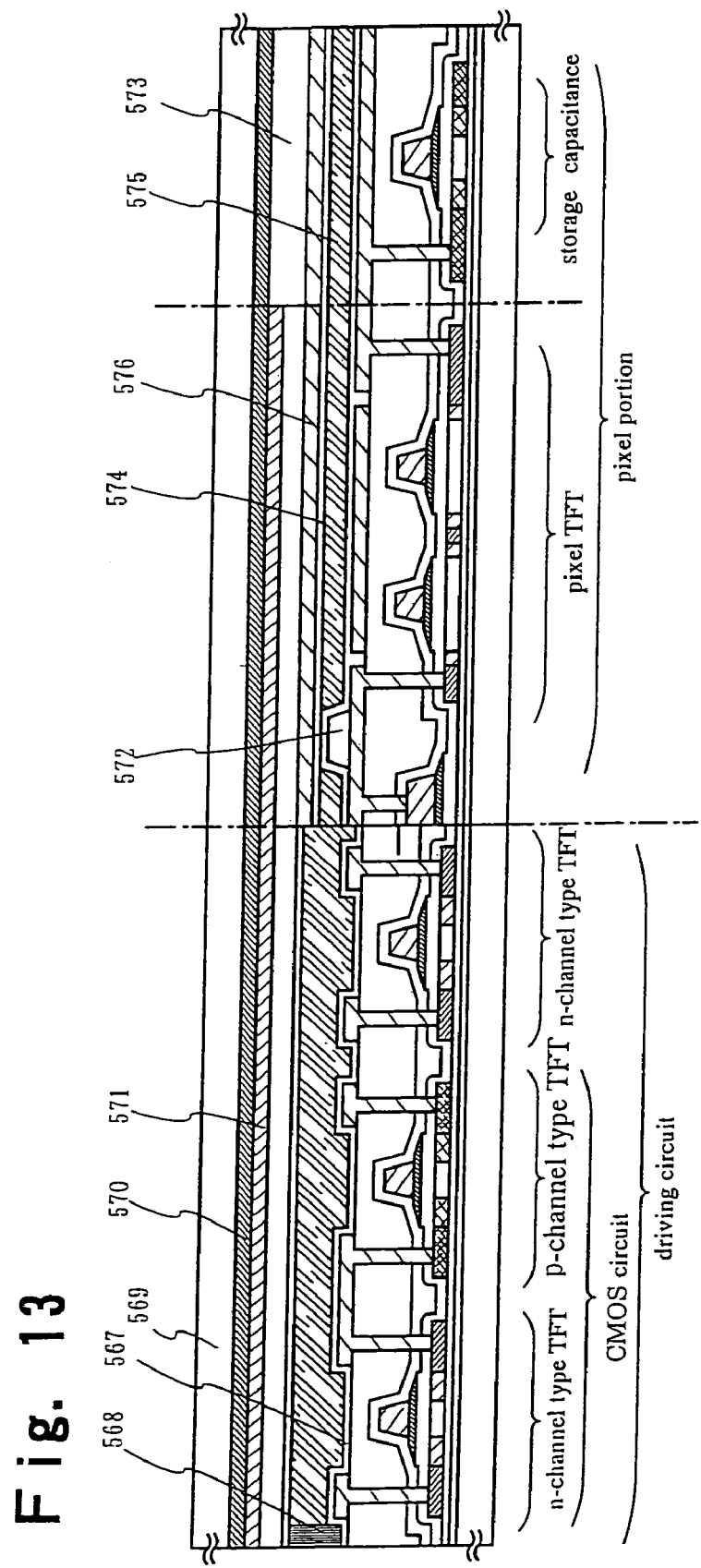
FIG. 13 is a sectional view illustrating a step of fabricating a liquid crystal display device of the active matrix type.

A process of manufacturing a reflection type liquid crystal display device from the active matrix substrate manufactured in Embodiment 4 is explained below in this embodiment. FIG. 13 is used in the explanation.

An active matrix substrate in the state of FIG. 11 is first obtained in accordance with Embodiment 4, an orientation film 567 is then formed on at least the pixel electrode 470 on the active matrix substrate of FIG. 11, and a rubbing process is performed. Note that, before forming the orientation film 567 in this embodiment, columnar spacer 572 is formed in desired positions by patterning an organic resin film, such as an acrylic resin film and the like, in order to maintain a gap between substrates. Further, spherical spacers may also be distributed over the entire surface of the substrate as a substitute for the columnar spacers.

An opposing substrate 569 is prepared next. Coloring layers 570 and 571, and a leveling film 573 are then formed on the opposing substrate 569. The red coloring layer 570 and a blue coloring layer 571 are overlapped to form a light shielding portion. Furthermore, the light shielding portion may also be formed by overlapping a portion of the red coloring layer with a green coloring layer.

The substrate shown in Embodiment 4 is used in this embodiment. Therefore, with the top view of the pixel portion of Embodiment 4 shown in FIG. 12, it is necessary that, at least, the gap between the gate wiring 469 and the pixel electrode 470, the gap between the gate wiring 469 and the connection electrode 468, and the gap between the connection electrode 468 and the pixel electrode 470 be shielded from light. Each of the coloring layers are arranged such that the light shielding portions made from the lamination of the coloring layers are formed in positions that must be shielded from light, and then are joined to the opposing substrate.

It is thus made possible to reduce the number of process steps by performing light shielding of the respective gaps between the pixels by using the light shielding portions, composed of the laminations of the coloring layers, without forming a light shielding layer such as a black mask.

An opposing electrode 576 made from a transparent conductive film is formed on the leveling film 573 over at least the pixel portion, an orientation film 574 is formed over the entire surface of the opposing substrate, and a rubbing process is performed.

The active matrix substrate on which the pixel portion and the driver circuit are formed, and the opposing substrate are then joined by a sealing material 568. A filler is mixed into the sealing material 568, and the two substrates are joined by the filler and the columnar spacers while maintaining a uniform gap. A liquid crystal material 575 is then injected between both substrates, and the substrates are completely sealed by using a sealant (not shown in the figure). A known liquid crystal material may be used for the liquid crystal material 575. The reflection type liquid crystal display device shown in FIG. 13 is thus completed. The active matrix substrate or the opposing substrate is then cut into a desired shape if necessary. In addition, a polarizing plate (not shown in the figure) is attached to only the opposing substrate. An FPC is then attached using a known technique.

Liquid crystal display device made by above-mentioned method has TFT manufactured by using the semiconductor film thoroughly annealed because the laser beam with a very excellent uniformity of the energy distribution is irradiated. It is possible to become the one with enough operation characteristic and reliability of the above-mentioned liquid crystal display device. Such a liquid crystal display can be used as a display portion in various kinds of electronic equipment.

Note that it is possible to freely combine this embodiment with Embodiments 1 to 4.

Embodiment 6

In this embodiment, an example of manufacturing the light emitting device by using a manufacturing method of TFT that is used for forming an active matrix substrate. In this specification, the light emitting device is the general term for the display panel enclosed a light emitting element formed on the substrate between the aforesaid substrate and the cover member, and to the display module equipped TFT with the aforesaid display panel. Incidentally, the light emitting element has a layer including a chemical compound in which an electroluminescence can be obtained by applying an electric field (a light emitting layer), an anode layer, and a cathode layer. Meanwhile, the electroluminescence in organic compound includes the light emission (fluorescence) upon returning from the singlet-excited state to the ground state and the light emission (phosphorescence) upon returning from the triplet-excited state to the ground state, including any or both of light emission.

In this specification, all layers formed between the anode and the cathode in the light emitting element are defined as the organic light emitting layer. The light emitting layer, the hole injection layer, the electron injection layer, the hole transportation layer, and the electron transportation layer, etc. are concretely included in the organic light emitting layer. The light emitting element basically has the structure that the anode layer, the light emitting layer, and the cathode layer are sequentially laminated. In addition to this structure, the light emitting element may also has a structure that the anode layer, the hole injection layer, the light emitting layer, and the cathode layer are sequentially laminated or a structure that the anode layer, the hole injection layer, the light emitting layer, the electron transportation layer, and the cathode layer etc. are sequentially laminated.

Figure 14:
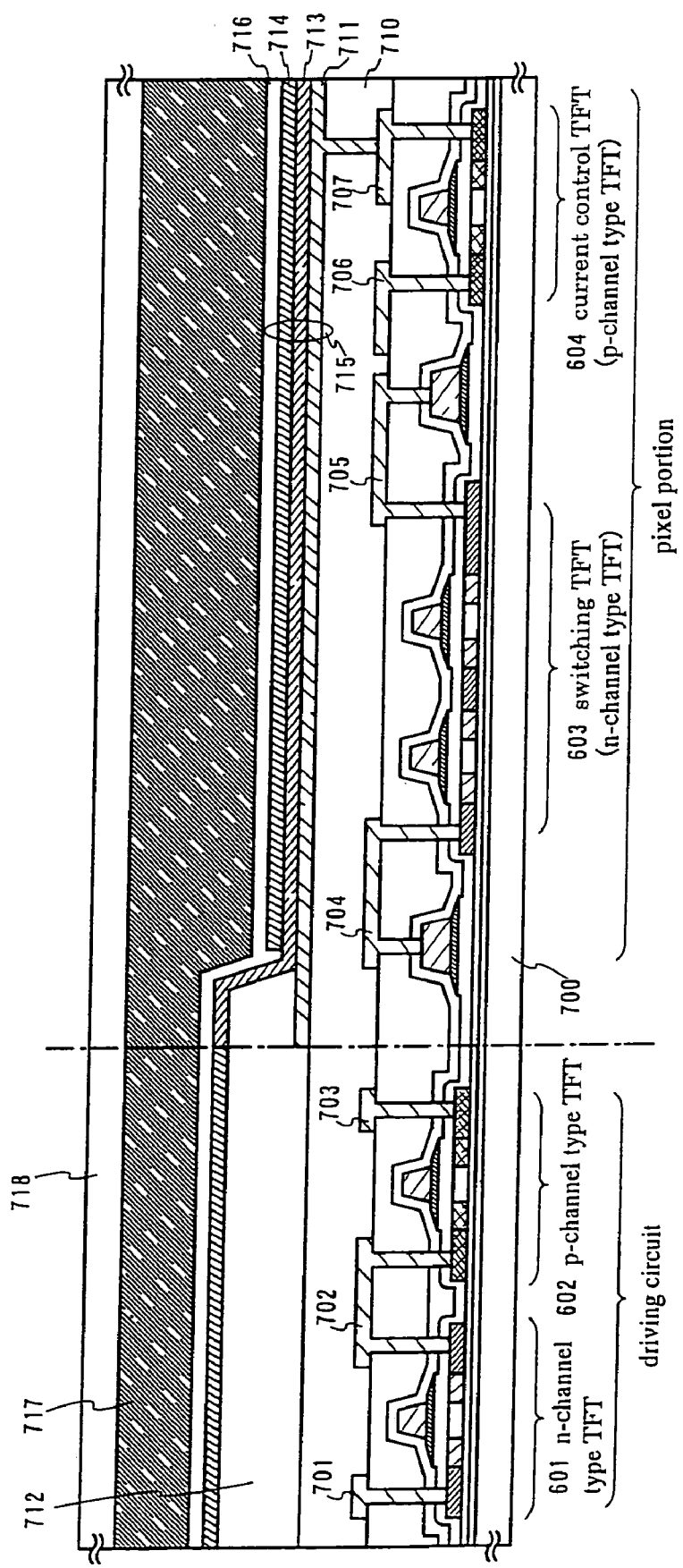
FIG. 14 is a sectional view illustrating the structure of a drive circuit and pixel units in the light-emitting device.

FIG. 14 is a sectional view of a light emitting device of this embodiment. In FIG. 14, the switching TFT 603 provided on the substrate 700 is formed by using the n-channel TFT 503 of FIG. 11. Consequently, concerning the explanation of the structure, it is satisfactory to refer the explanation on the n-channel TFT 503.

Incidentally, although this embodiment is of a double gate structure formed with two channel regions, it is possible to use a single gate structure formed with one channel region or a triple gate structure formed with three.

The driver circuit provided on the substrate 700 is formed by using the CMOS circuit of FIG. 11. Consequently, concerning the explanation of the structure, it is satisfactory to refer the explanation on the n-channel TFT 501 and p-channel TFT 502. Incidentally, although this embodiment is of a single gate structure, it is possible to use a double gate structure or a triple gate structure.

Meanwhile, the wirings 701, 703 serve as source wirings of the CMOS circuit while the wiring 702 serves as a drain wiring. Meanwhile, a wiring 704 serves as a wiring to electrically connect between the source wiring 708 and the source region of the switching TFT while the wiring 705 serves as a wiring to electrically connect between the drain wiring 709 and the drain region of the switching TFT.

Incidentally, a current control TFT 604 is formed by using the p-channel TFT 502 of FIG. 11. Consequently, concerning the explanation of the structure, it is satisfactory to refer to the explanation on the p-channel TFT 502. Incidentally, although this embodiment is of a single gate structure, it is possible to use a double gate structure or a triple gate structure.

Meanwhile, the wiring 706 is a source wiring of the current control TFT (corresponding to a current supply line)

while the wiring 707 is an electrode to be electrically connected to the pixel electrode 711.

Meanwhile, reference numeral 711 is a pixel electrode (anode of a light-emitting element) formed by a transparent conductive film. As the transparent conductive film can be used a compound of indium oxide and tin oxide, a compound of indium oxide and zinc oxide, zinc oxide, tin oxide or indium oxide, or otherwise may be used a transparent conductive film as above added with gallium. The pixel electrode 711 is formed on a planar interlayer insulating film 710 prior to forming the wirings. In this embodiment, it is very important to planarize the step due to the TFT by using a planarizing film 710 made of resin. A light-emitting layer to be formed later, because being extremely small in thickness, possibly causes poor light emission due to the presence of a step. Accordingly, it is desired to provide planarization prior to forming a pixel electrode so that a light emitting layer can be formed as planar as possible.

After forming the wirings 701 to 707, a bank 712 is formed as shown in FIG. 14. The bank 712 may be formed by patterning an insulating film or organic resin film containing silicon having 100 to 400 nm.

Incidentally, because the bank 712 is an insulating film, caution must be paid to element electrostatic breakdown during deposition. In this embodiment added is a carbon particle or metal particle to an insulating film as a material for the bank 712, thereby reducing resistivity and suppressing occurrence of static electricity. In such a case, the addition amount of carbon particle or metal particle may be adjusted to provide a resistivity of $1 \times 10^6$ to $1 \times 10^{12}$ $\Omega$m (preferably $1 \times 10^8$ to $1 \times 10^{10}$ $\Omega$m).

A light emitting layer 713 is formed on the pixel electrode 711. Incidentally, although FIG. 14 shows only one pixel, this embodiment separately forms the light emitting layer correspondingly to the respective colors of R (red), G (green) and B (blue). Meanwhile, in this embodiment is formed a low molecular weight organic light emitting material by evaporation. Specifically, this is a lamination structure having a copper phthalocyanine (CuPc) film provided in a thickness of 20 nm as a hole injecting layer and a tris-8-qyuinolinolato aluminum complex (Alq$_3$) film provided thereon in a thickness of 70 nm as a light-emitting layer. The color of emission light can be controlled by adding a fluorescent pigment, such as quinacridone, perylene or DCM1, to Alq$_3$.

However, the foregoing example is an example of organic light emitting material to be used for a light-emitting layer and not necessarily limited to this. It is satisfactory to form a light emitting layer (layer for light emission and carrier movement therefore) by freely combining a light-emitting layer, a charge transporting layer and a charge injecting layer. For example, although in this embodiment was shown the example in which a low molecular weight organic light emitting material is used for a light emitting layer, it is possible to use an intermediate organic light emitting material and a high molecular weight organic light emitting material. Furthermore, an organic light-emitting material, having no sublimation property but having molecules in the number of 20 or less or chained molecules having a length of 10 μm or less, is provided as a intermediate molecular organic light emitting material. For an example of using the high molecular weight organic light emitting material, a polythiophene (PEDOT) film with a thickness of 20 nm is formed by the spin coating method as a hole injection layer and the lamination structure installing paraphenylenvinylene (PPV) of about 100 nm on it as a light emitting layer may be good. The luminescence wave length can be selected from red to blue by using the π-conjugated type polymer of PPV. Meanwhile, it is possible to use an inorganic material such as silicon carbide for a charge transporting layer or a charge injecting layer. These organic light emitting materials or inorganic materials can be a known material.

Next, a cathode 714 made of a conductive film is provided on the light-emitting layer 713. In this embodiment, an alloy film of aluminum and lithium is used as the conductive film. Of course, a known MgAg film (alloy film of magnesium and silver) may be used. As the cathode material may be used a conductive film of an element belonging to the periodic-table group 1 or 2, or a conductive film added with such an element.

A light-emitting element 715 is completed at a time having formed up to the cathode 714. Incidentally, the light-emitting element 715 herein refers to a diode formed with a pixel electrode (anode) 711, a light-emitting layer 713 and a cathode 714.

It is effective to provide a passivation film 716 in such a manner to completely cover the light emitting element 715. The passivation film 716 is formed by an insulating film including a carbon film, a silicon nitride film or a silicon oxynitride film, and used is the insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range not more than 100° C. from room temperature, can be easily deposited over the light emitting layer 713 low in heat resistance. Meanwhile, the DLC film, having a high blocking effect to oxygen, can suppress the light emitting layer 713 from oxidizing. Consequently, the problem of oxidation can be prevented in the light-emitting layer 713 during the following sealing process.

Furthermore, a sealing member 717 is provided on the passivation film 716 so as to bond a cover member 718. For the sealing member 717 used may be an ultraviolet curable resin. It is effective to provide therein a substance having a hygroscopic effect or an antioxidant effect. Meanwhile, in this embodiment, for the cover member 718 used is a glass substrate, quartz substrate, plastic substrate (including a plastic film) or flexible substrate having carbon films (preferably diamond-like carbon films) formed on the both surfaces thereof. In addition to the carbon film, the aluminum film (such as AlON, AlN, and AlO), SiN and the like are used.

Thus, completed is a light emitting device having a structure as shown in FIG. 14. Incidentally, it is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFTs 601 and 602, a switching TFT (n-channel TFT) 603 and a current control TFT (n-channel TFT) 604 are formed on the substrate 700.

Furthermore, as was explained using FIG. 14, by providing an impurity region overlapped with the gate electrode through an insulating film, it is possible to form an n-channel TFT resistive to the deterioration resulting from hot-carrier effect. Consequently, a light emitting device with high reliability can be realized.

Meanwhile, this embodiment shows only the configuration of the pixel portion and driver circuit. However, according to the manufacturing process in this embodiment, besides these, it is possible to form on the same insulating member such logic circuits as a signal division circuit, a D/A converter, an operation amplifier, a γ-correction circuit or the like. Furthermore, a memory or microprocessor can be formed.

The light emitting device formed by the above-mentioned method has TFT formed by using the semiconductor film thoroughly annealed, because it is uniformly irradiated the laser beam that has a very excellent energy density. Therefore, the above-mentioned light emitting device is obtained enough operation characteristic and reliability. Such a light emitting device can be used as display portions of various electronic equipments.

Incidentally, this Embodiment can be freely combined with Embodiments 1 to 4.

Embodiment 7

Various semiconductor devices (active matrix type liquid crystal display device, active matrix type light emitting device or active matrix type EC display device) can be formed by applying the present invention. Specifically, the present invention can be embodied in electronic equipment of any type in which such an electro-optical device is incorporated in a display portion.

Such electronic equipment is a video camera, a digital camera, a projector, a head-mounted display (goggle type display), a car navigation system, a car stereo, a personal computer, a mobile information terminal (such as a mobile computer, a mobile telephone or an electronic book etc.) or the like. FIGS. 15A to 15F, 16A to 16D, and 17A to 17C show one of its examples.

FIG. 15A shows a personal computer which includes a main body 3001, an image input portion 3002, a display portion 3003, a keyboard 3004 and the like. The personal computer of the present invention can be completed by applying the semiconductor device manufactured by the present invention to the display portion 3003.

FIG. 15B shows a video camera which includes a main body 3101, a display portion 3102, a sound input portion 3103, operating switches 3104, a battery 3105, an image receiving portion 3106 and the like. The video camera of the present invention can be completed by applying the semiconductor device manufactured by the present invention to the display portion 3102.

FIG. 15C shows a mobile computer which includes a main body 3201, a camera portion 3202, an image receiving portion 3203, an operating switch 3204, a display portion 3205 and the like. The mobile computer of the present invention can be completed by applying the semiconductor device manufactured by the present invention to the display portion 3205.

FIG. 15D shows a goggle type display which includes a main body 3301, a display portion 3302, arm portions 3303 and the like. The display portion 3302 uses a flexible substrate as a substrate, and the goggle type display is manufactured by bending the display portion 3302. Further, a lightweight and thin goggle type display is realized. The goggle type display of the present invention can be completed by applying the semiconductor device manufactured by the present invention to the display portion 3302.

FIG. 15E shows a player using a recording medium on which a program is recorded (hereinafter referred to as the recording medium), and the player includes a main body 3401, a display portion 3402, speaker portions 3403, a recording medium 3404, operating switches 3405 and the like. This player uses a DVD (Digital Versatile Disc), a CD and the like as the recording medium, and enables a user to enjoy music, movies, games and the Internet. The recording medium of the present invention can be completed by applying the semiconductor device manufactured by the present invention to the display portion 3402.

FIG. 15F shows a digital camera which includes a body 3501, a display portion 3502, an eyepiece portion 3503, operating switches 3504, an image receiving portion (not shown) and the like. The digital camera of the present invention can be completed by applying the semiconductor device manufactured by the present invention to the display portion 3502.

Figure 16A:
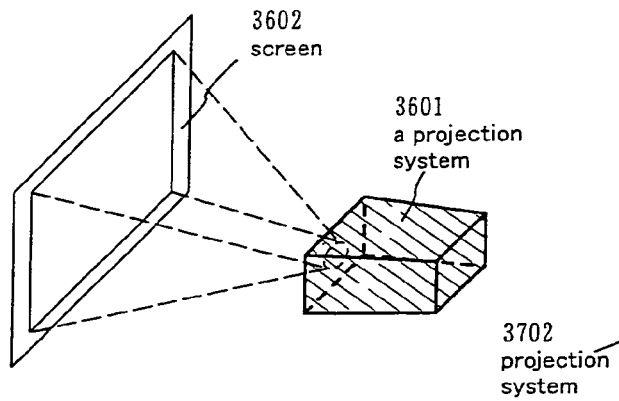
FIGS. 16A to D are views illustrating examples of the semiconductor device.

FIG. 16A shows a front type projector which includes a projection device 3601, a screen 3602 and the like. The front type projector can be completed by applying a liquid crystal display device 3808 which constitutes a part of the projection device 3601 and other driver circuits.

Figure 16B:
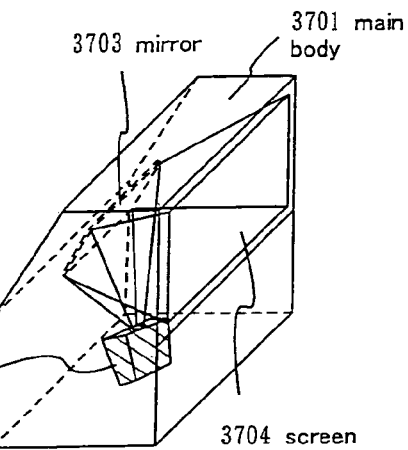

FIG. 16B shows a rear type projector which includes a main body 3701, a projection device 3702, a mirror 3703, a screen 3704 and the like. The rear type projector can be completed by applying the liquid crystal display device 3808 which constitutes a part of the projection device 3702 and other driver circuits.

Figure 16C:
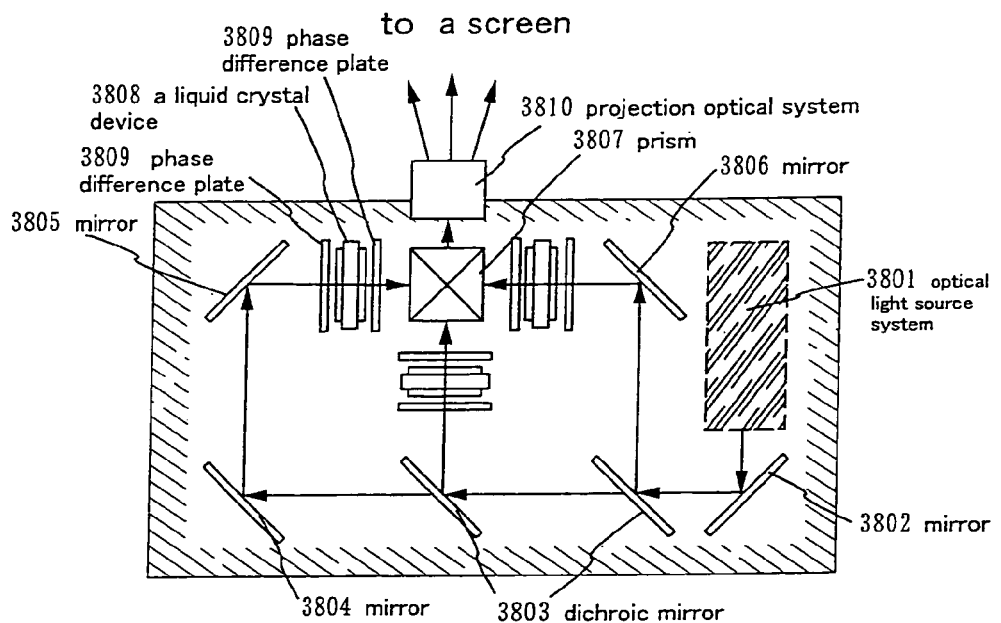

FIG. 16C shows one example of the structure of each of the projection devices 3601 and 3702 which are respectively shown in FIGS. 16A and 16B. Each of the projection devices 3601 and 3702 is made of a light source optical system 3801, mirrors 3802 and 3804 to 3806, a dichroic mirror 3803, a prism 3807, a liquid crystal display device 3808, a phase difference plate 3809 and a projection optical system 3810. The projection optical system 3810 is made of an optical system including a projection lens. This embodiment is an example of a three-plate type, but it is not limited to this example and may also be of a single-plate type. In addition, those who embody the invention may appropriately dispose an optical system such as an optical lens, a film having a polarization function, a film for adjusting phase difference, an IR film or the like in an optical path indicated by arrows in FIG. 16C.

Figure 16D:
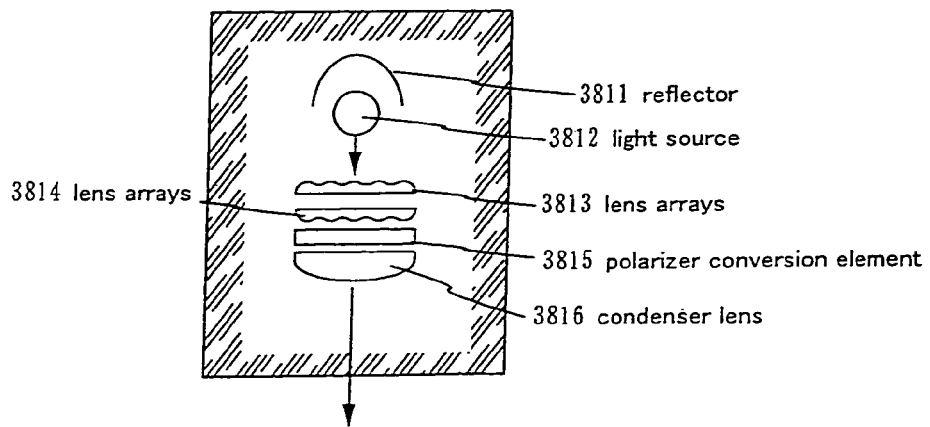

FIG. 16D is a view showing one example of the structure of the light source optical system 3801 shown in FIG. 16C. In this embodiment, the light source optical system 3801 is made of a reflector 3811, a light source 3812, lens arrays 3813 and 3814, a polarizing conversion element 3815 and a condenser lens 3816. Incidentally, the light source optical system shown in FIG. 16D is one example, and the invention is not particularly limited to the shown construction. For example, those whose embody the invention may appropriately dispose an optical system such as an optical lens, a film having a polarization function, a film for adjusting phase difference, an IR film or the like.

The projector shown in FIGS. 16A to 16D is of the type using a transparent type of electro-optical device, but there is not shown an example in which the invention is applied to a reflection type of electro-optical device and a light emitting device.

Figure 17A:
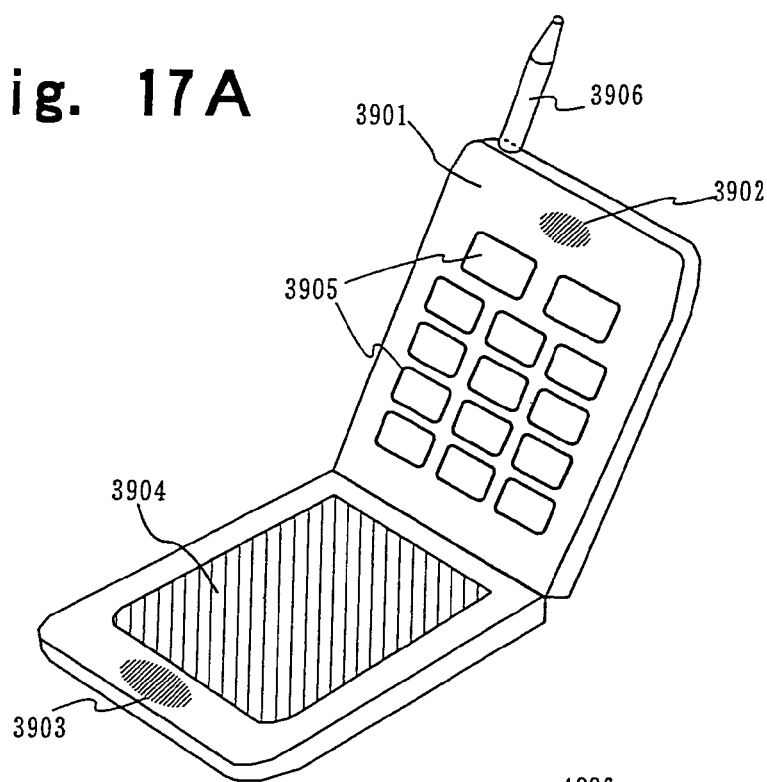
FIGS. 17A, B and C are views illustrating examples of the semiconductor device.

FIG. 17A shows a mobile telephone which includes a main body 3901, a sound output portion 3902, a sound input portion 3903, a display portion 3904, operating switches 3905, an antenna 3906 and the like. The mobile telephone of the present invention can be completed by applying the semiconductor device manufactured by the present invention to the display portion 3904.

Figure 17B:
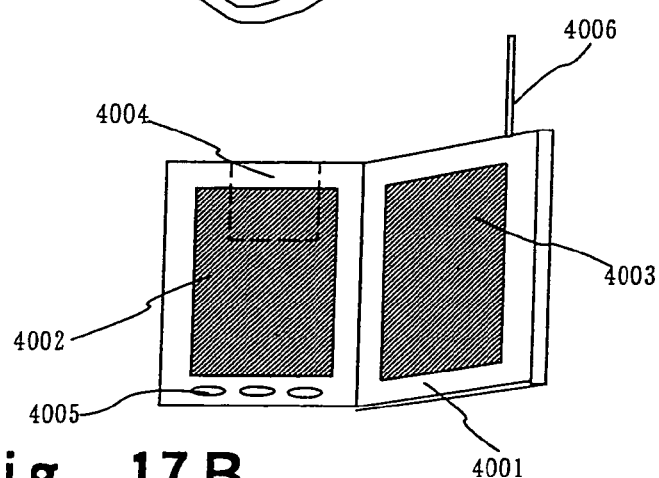

FIG. 17B shows a mobile book (electronic book) which includes a main body 4001, display portions 4002 and 4003, a storage medium 4004, operating switches 4005, an antenna 4006 and the like. The mobile book of the present invention can be completed by applying the semiconductor device manufactured by the present invention to the display portions 4002 and 4003. The mobile book of the present invention can be made for the same size as a pocket edition, and the utility is high.

Figure 17C:
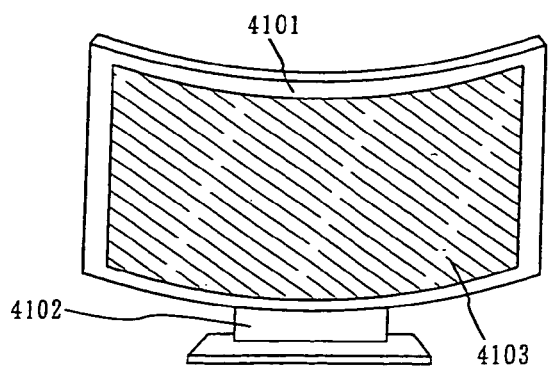

FIG. 17C shows a display which includes a main body 4101, a support base 4102, a display portion 4103 and the like. The display portion 4103 is manufactured by using a flexible substrate, and a lightweight and thin display can be realized. Further, it is possible that the display portion 4103 is bent. The display of the present invention can be completed by applying the semiconductor device manufactured by the present invention to the display portion 4103. The invention is particularly advantageous to a large-screen display, and is advantageous to a display having a diagonal size of 10 inches or more (particularly, 30 inches or more).

As is apparent from the foregoing description, the range of applications of the invention is extremely wide, and the invention can be applied to any category of electronic apparatus. Electronic apparatus according to the invention can be realized by using a construction made of a combination of arbitrary ones of Embodiments 1 to 5 or Embodiments 1 to 6.

Employment of the constitution of the invention offers fundamentally significant meanings as described below.

(a) The laser beam is permitted to be incident on the semiconductor film at an angle of incidence satisfying the formula of the invention, and the angle of incidence of the laser beam is alternately changed depending upon the direction of scanning the semiconductor film with the laser beam. Then, there occurs no difference in the irradiation with the laser beam irrespective of the scanning direction, and a homogeneous irradiation with the laser beam is accomplished. The angle of incidence which is not 0° helps suppress the interference of laser beam on the surface of the semiconductor film, and there is obtained a semiconductor film having homogeneous properties.

(b) The member being irradiated is homogeneously annealed. In particular, the invention is adapted to improving crystallization and crystallinity of the semiconductor film and to activating impurity elements.

(c) The invention makes it possible to improve the throughput.

(d) The semiconductor device as represented by the liquid crystal display device of the active matrix type makes it possible to improve operation characteristics and reliability yet satisfying the above advantages. It is further allowed to produce the semiconductor device at a decreased cost.

What is claimed is:

1. A method of irradiating a laser beam comprising:
    emitting a laser beam from a laser;
    irradiating an irradiation surface with the laser beam at a first angle of incidence while moving the irradiation surface in a first direction; and
    irradiating the irradiation surface with the laser beam at a second angle of incidence while moving the irradiation surface in a second direction which is opposite to the first direction,
    wherein an inner product of a unit vector in the first direction and a unit vector in a direction of incidence of the laser beam at the first angle is equal to an inner product of a unit vector in the second direction and a unit vector in a direction of incidence of the laser beam at the second angle.

2. A method of irradiating a laser beam according to claim 1, wherein the first angle and the second angle are 2.0 or more.

3. A method of irradiating a laser beam according to claim 1, wherein the laser beam emitted from the laser is shaped into an elongated beam on the irradiation surface or in the vicinities thereof.

4. A method of irradiating a laser beam according to claim 1, wherein the laser is any one laser selected from a continuously oscillating gas laser, a continuously oscillating solid laser and a continuously oscillating metal laser.

5. A method of irradiating a laser beam according to claim 1, wherein the laser is any one laser selected from a continuously oscillating gas laser, a continuously oscillating solid laser and a continuously oscillating metal laser.

6. A method of irradiating a laser beam according to claim 1, wherein the first angle is equal to the second angle.

7. A method of irradiating a laser beam according to claim 1, wherein the first angle is greater than or equal to 2° and less than 90° and the second angle is greater than or equal to 2° and less than 90°.

8. A method of irradiating a laser beam according to claim 3, wherein a length of short diameter of the elongated beam is not longer than 50 μm.

9. A method of irradiating a laser beam comprising:
    emitting a laser beam from a laser;
    irradiating an irradiation surface with the laser beam at a first angle of incidence while moving the irradiation surface in a first direction in parallel with a short diameter direction of the laser beam; and
    irradiating the irradiation surface with the laser beam at a second angle of incidence while moving the irradiation surface in a second direction which is opposite to the first direction,
    wherein an inner product of a unit vector in the first direction and a unit vector in a direction of incidence of the laser beam at the first angle is equal to an inner product of a unit vector in the second direction and a unit vector in a direction of incidence of the laser beam at the second angle.

10. A method of irradiating a laser beam according to claim 9, wherein the first angle and the second angle are 2.0 or more.

11. A method of irradiating a laser beam according to claim 9, wherein the laser beam emitted from the laser is shaped into an elongated beam on the irradiation surface or in the vicinities thereof.

12. A method of irradiating a laser beam according to claim 11, wherein a length of short diameter of the elongated beam is not longer than 50 μm.

13. A method of irradiating a laser beam according to claim 9, wherein the first angle is equal to the second angle.

14. A method of irradiating a laser beam according to claim 9, wherein the first angle is greater than or equal to 2° and less than 90° and the second angle is greater than or equal to 2° and less than 90°.

15. A method of fabricating a semiconductor device comprising:
    emitting a laser beam from a laser;
    irradiating a semiconductor film with the laser beam at a first angle of incidence while moving the semiconductor film in a first direction; and
    irradiating the semiconductor film, with the laser beam at ,a second angle of incidence while moving the semiconductor film in a second direction which is opposite to the first direction, wherein an inner product of a unit vector in the first direction and a unit vector in a direction of incidence of the laser beam at the first angle is equal to an inner product of a unit vector in the second direction and a unit vector in a direction of incidence of the laser beam at the second angle.

16. A method of fabricating a semiconductor device according to claim 15, wherein the first angle and the second angle are 2.0 or more.

17. A method of fabricating a semiconductor device according to claim 15, wherein the laser beam emitted from the laser is shaped into an elongated beam on the semiconductor film or in the vicinities thereof.

18. A method of fabricating a semiconductor device according to claim 15, wherein the laser is any one laser selected from a continuously oscillating gas laser, a solid laser and a metal laser.

19. A method of fabricating a semiconductor device according to claim 15, wherein the laser beam is a continuously oscillating laser having second harmonics.

20. A method of fabricating a semiconductor device according to claim 15, wherein the laser beam has a shape having an aspect ratio of 2 or more.

21. A method of fabricating a semiconductor device according to claim 15, wherein the laser beam is oscillated by TEMoo.

22. A method of irradiating a laser beam according to claim 15, wherein the first angle is equal to the second angle.

23. A method of irradiating a laser beam according to claim 15, wherein the first angle is greater than or equal to 2° and less than 90° and the second angle is greater than or equal to 2° and less than 90°.

24. A method of fabricating a semiconductor device according to claim 17, wherein a length of short diameter of the elongated beam is not longer than 50 μm.

25. A method of fabricating a semiconductor device according to claim 18, wherein the continuously oscillating gas laser is any one laser selected from Ar laser, a Kr laser, an XeF excimer laser or a $CO_2$ laser.

26. A method of fabricating a semiconductor device according to claim 18, wherein the solid laser is any one laser selected from a YAG laser, a $YVO_4$ laser, a YLF laser, a $YAlO_3$ laser, a glass laser, a ruby laser, an alexandrite laser or a Ti:sapphire laser.

27. A method of fabricating a semiconductor device according to claim 18, wherein the metal laser is any one laser selected from a helium cadmium laser, a copper vapor laser or a gold vapor laser.

28. A method of fabricating a semiconductor device comprising:
emitting a laser beam from a laser;
irradiating a semiconductor film with the laser beam at a first angle of incidence while moving the semiconductor film in a first direction in parallel with a short diameter direction of the laser beam; and
irradiating the semiconductor film with the laser beam at a second angle of incidence while moving the semiconductor film in a second direction which is opposite to the first direction,
wherein an inner product of a unit vector in the first direction and a unit vector in a direction of incidence of the laser beam at the first angle is equal to an inner product of a unit vector in the second direction and a unit vector in a direction of incidence of the laser beam at the second angle.

29. A method of fabricating a semiconductor device according to claim 28, wherein the first angle and the second angle are 2.0 or more.

30. A method of fabricating a semiconductor device according to claim 28, wherein the laser beam emitted from the laser is shaped into an elongated beam on the semiconductor film or in the vicinities thereof.

31. A method of fabricating a semiconductor device according to claim 28, wherein the laser is any one laser selected from a continuously oscillating gas laser, a solid laser and a metal laser.

32. A method of fabricating a semiconductor device according to claim 28, wherein the laser beam is a continuously oscillating laser having second harmonics.

33. A method of fabricating a semiconductor device according to claim 28, wherein the laser beam has a shape having an aspect ratio of 2 or more.

34. A method of fabricating a semiconductor device according to claim 28, wherein the laser beam is oscillated by TEMoo.

35. A method of irradiating a laser beam according to claim 28, wherein the first angle is equal to the second angle.

36. A method of irradiating a laser beam according to claim 28, wherein the first angle is greater than or equal to 2° and less than 90° and the second angle is greater than or equal to 2° and less than 90°.

37. A method of fabricating a semiconductor device according to claim 30, wherein a length of short diameter of the elongated beam is not longer than 50 μm.

38. A method of fabricating a semiconductor device according to claim 31, wherein the continuously oscillating gas laser is any one laser selected from Ar laser, a Kr laser, an XeF excimer laser or a $CO_2$ laser.

39. A method of fabricating a semiconductor device according to claim 31, wherein the solid laser is any one laser selected from a YAG laser, a $YVO_4$ laser, a YLF laser, a $YAlO_3$ laser, a glass laser, a ruby laser, an alexandrite laser or a Ti:sapphire laser.

40. A method of fabricating a semiconductor device according to claim 31, wherein the metal laser is any one laser selected from a helium cadmium laser, a copper vapor laser or a gold vapor laser.

* * * * *